(12) United States Patent
Yamanaka et al.

(10) Patent No.: US 7,339,975 B2
(45) Date of Patent: Mar. 4, 2008

(54) APPARATUS FOR SYNTHESIZING LASER BEAMS

(75) Inventors: Fusao Yamanaka, Kaisei-machi (JP); Yoji Okazaki, Kaisei-machi (JP); Chiaki Goto, Kaisei-machi (JP); Shinichi Shimotsu, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 229 days.

(21) Appl. No.: 10/769,995

(22) Filed: Feb. 3, 2004

(65) Prior Publication Data
US 2004/0233964 A1  Nov. 25, 2004

(30) Foreign Application Priority Data

| Feb. 3, 2003 | (JP) | ............................. 2003-025657 |
| Feb. 3, 2003 | (JP) | ............................. 2003-025658 |
| Jan. 7, 2004 | (JP) | ............................. 2004-002237 |

(51) Int. Cl.
*H01S 3/08* (2006.01)
(52) U.S. Cl. .................. 372/108; 372/101; 372/50.12; 385/33
(58) Field of Classification Search ............... 372/6, 372/50.12, 71, 101, 108; 359/618, 641; 385/31–38
See application file for complete search history.

(56) References Cited

U.S. PATENT DOCUMENTS

| 5,333,077 | A |   | 7/1994 | Legar et al. ................. 359/619 |
| 5,862,278 | A | * | 1/1999 | Brauch et al. ................ 385/34 |
| 6,072,811 | A | * | 6/2000 | Fermann et al. .............. 372/11 |
| 6,124,973 | A | * | 9/2000 | Du et al. ..................... 359/618 |
| 6,151,168 | A | * | 11/2000 | Goering et al. ............. 359/623 |
| 6,400,513 | B1 | * | 6/2002 | Southwell .................... 359/641 |
| 6,462,883 | B1 |   | 10/2002 | Wang et al. |
| 6,639,727 | B2 | * | 10/2003 | Kusuyama ................... 359/619 |
| 2002/0090172 | A1 | * | 7/2002 | Okazaki et al. .............. 385/27 |
| 2003/0035460 | A1 | * | 2/2003 | Tsikos et al. ................ 372/101 |

(Continued)

FOREIGN PATENT DOCUMENTS

JP          05288956 A   * 11/1993

OTHER PUBLICATIONS

State Intellectual Property office of PRC, First Office Action for Appln. No. 200410003601.4, dated Sep. 8, 2006.

*Primary Examiner*—Haissa Philogene
*Assistant Examiner*—Tung X Le
(74) *Attorney, Agent, or Firm*—Sughrue Mion, PLLC

(57) ABSTRACT

(Problem to be solved) To provide a laser beam synthesizing apparatus which is small in size and high in output power.
(Means for solving the problem) A convergent angle transforming optical system 30 is disposed further upstream of the upstream-most position Pa in the positions where the optical axes of beam bundles La, Lb, Lc . . . which are radiated from a plurality of semiconductor lasers 11A, 11B, 112C . . . and converged in the fast axis view by a converging/dispersion lens 120 intersect each other in the fast axis view, and the whole beam bundle made up of the beam bundles La, Lb, Lc . . . passed through the converging/dispersion lens 120 is converged in the fast axis view by the convergent angle transforming optical system 30 so that the angle of convergence of the whole beam bundle is made smaller in the fast axis view, and introduced into the core 41 of an optical fiber 40.

35 Claims, 21 Drawing Sheets

U.S. PATENT DOCUMENTS

Figure 2:
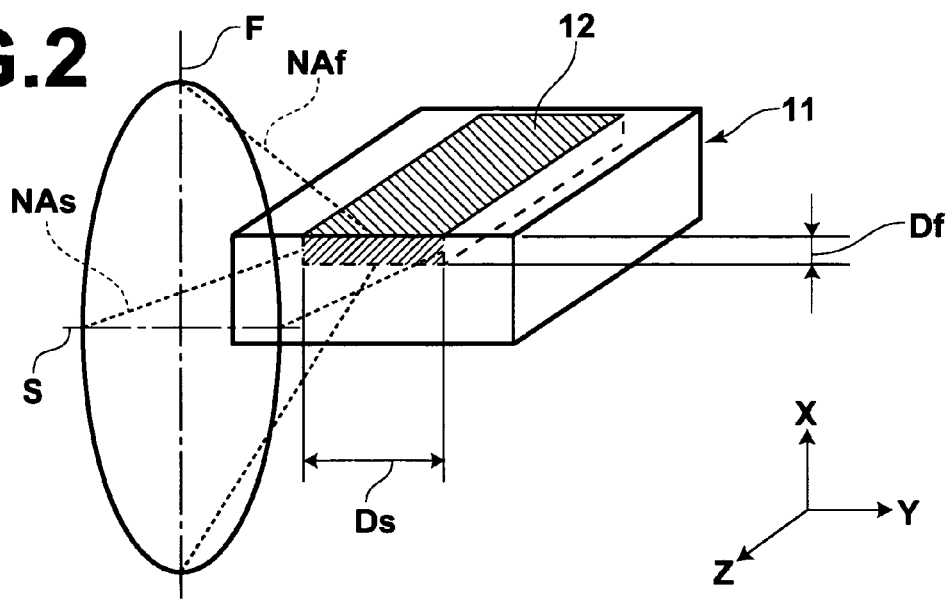

| | | | |
|---|---|---|---|
| 2003/0035461 A1* | 2/2003 | Tsikos et al. | 372/108 |
| 2003/0043472 A1* | 3/2003 | Mandella | 359/641 |
| 2004/0042719 A1* | 3/2004 | Gardner et al. | 385/33 |
| 2004/0062479 A1* | 4/2004 | Capewell | 385/36 |
| 2004/0091013 A1* | 5/2004 | Yamaguchi et al. | 372/108 |

* cited by examiner

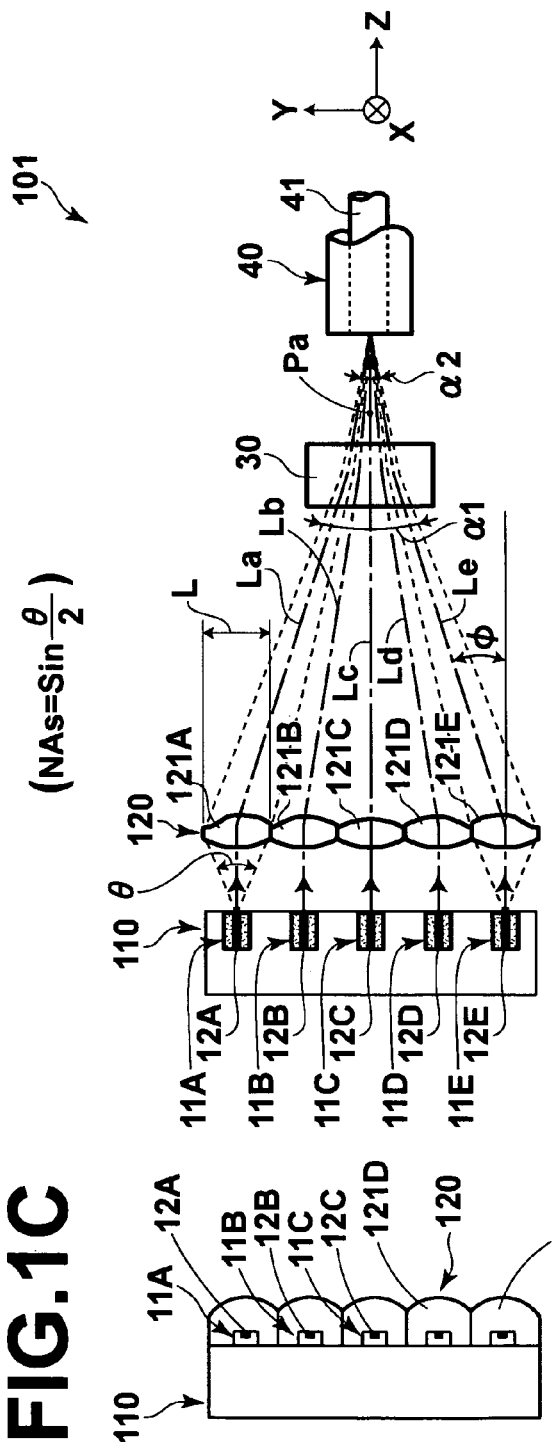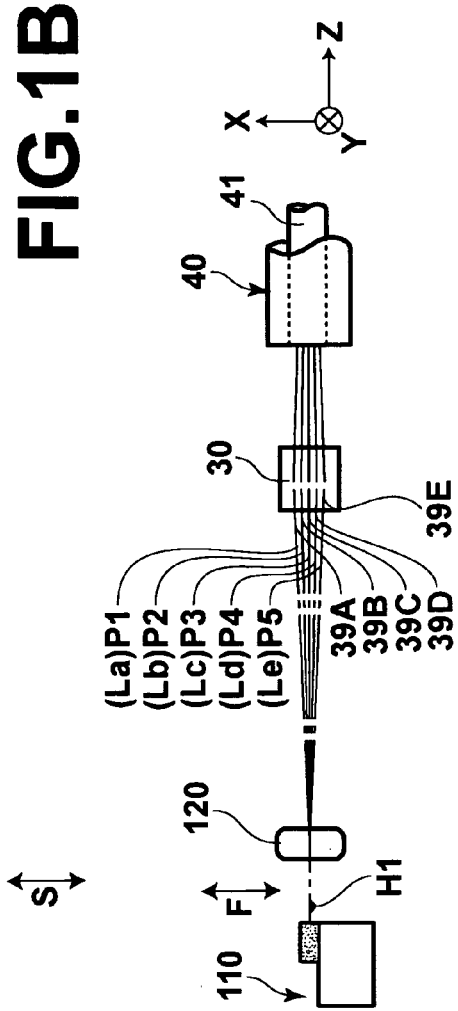

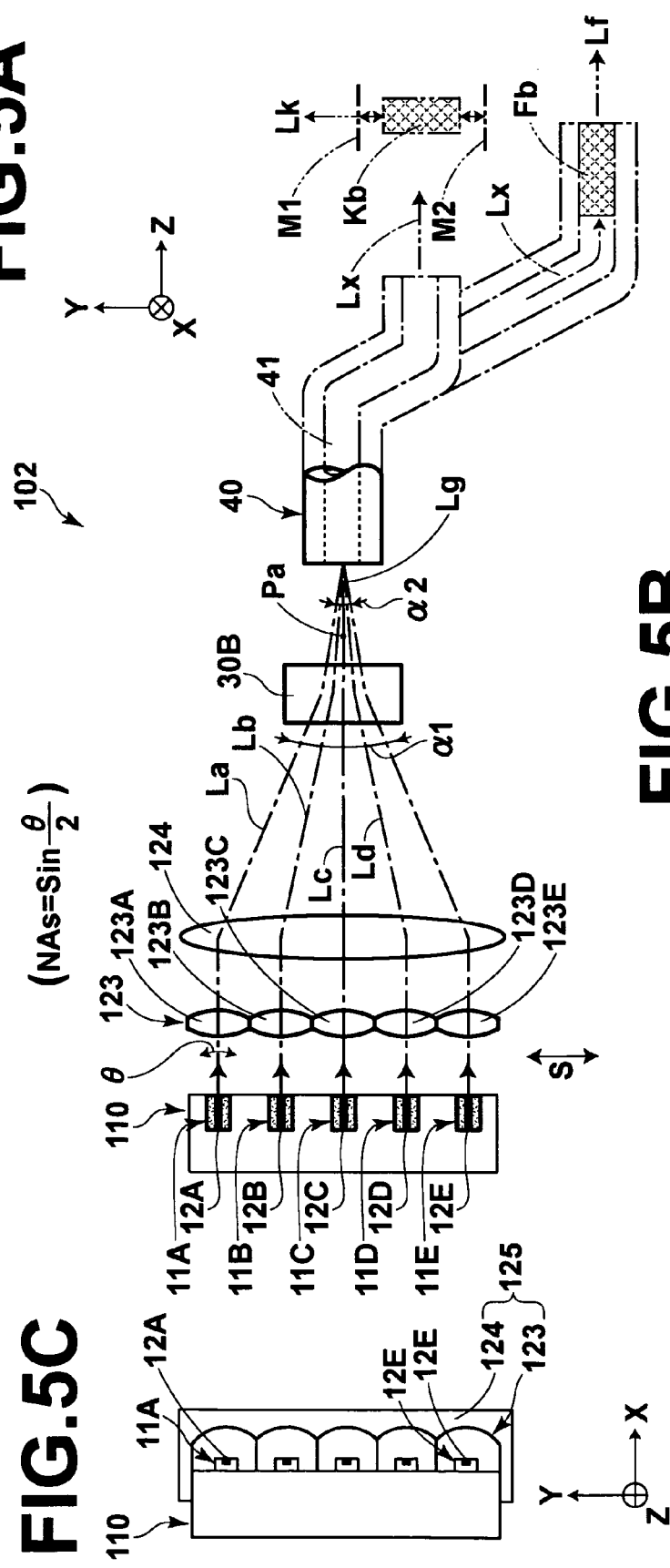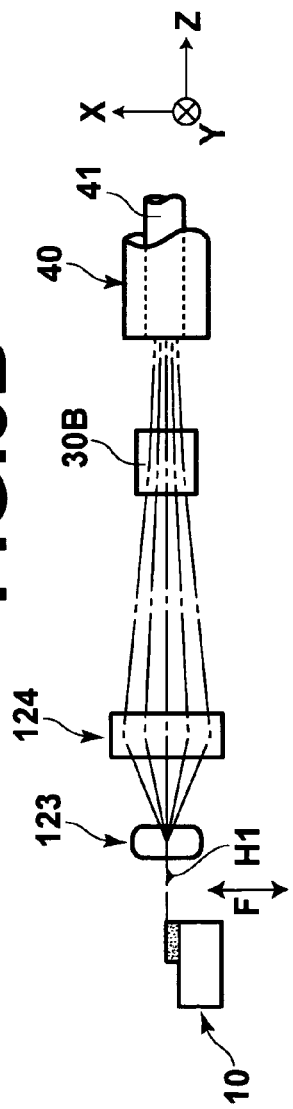

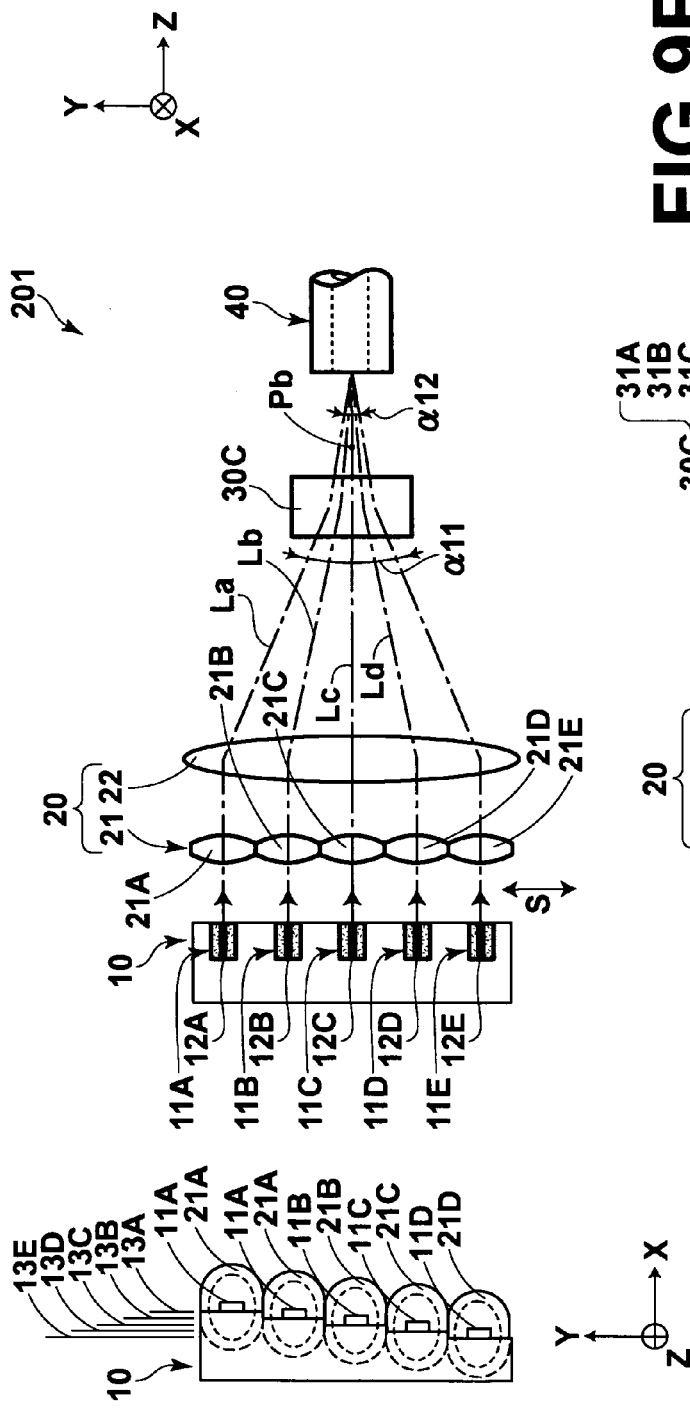

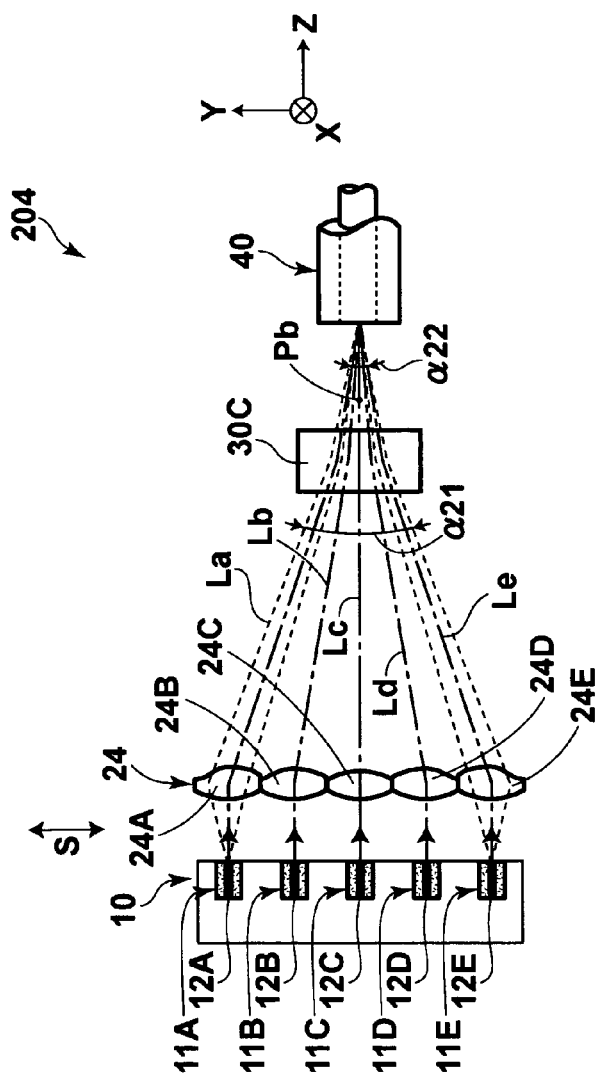
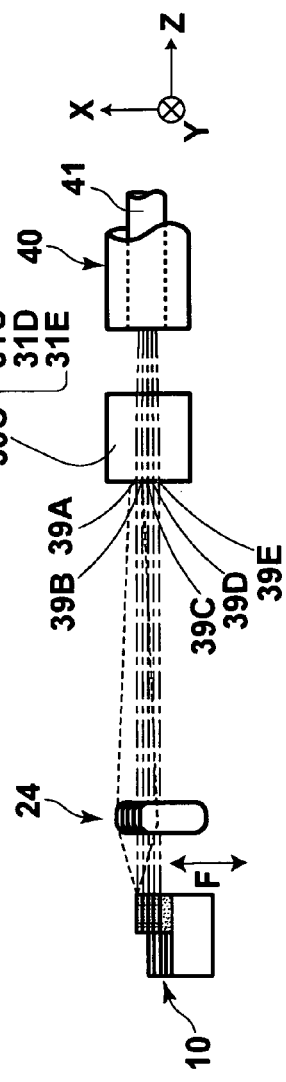
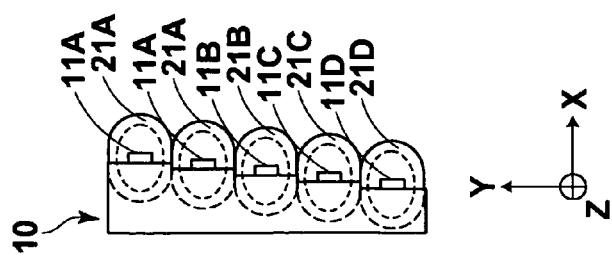

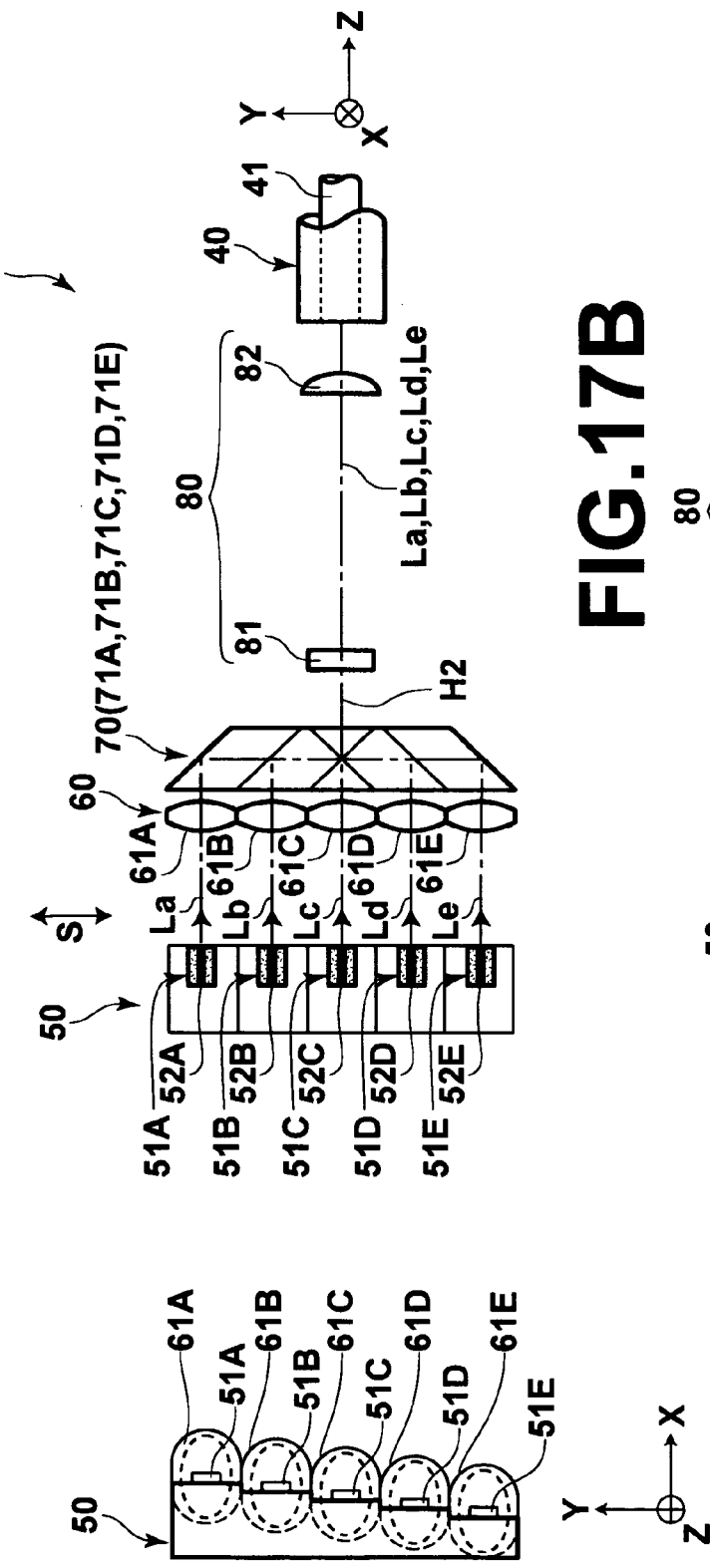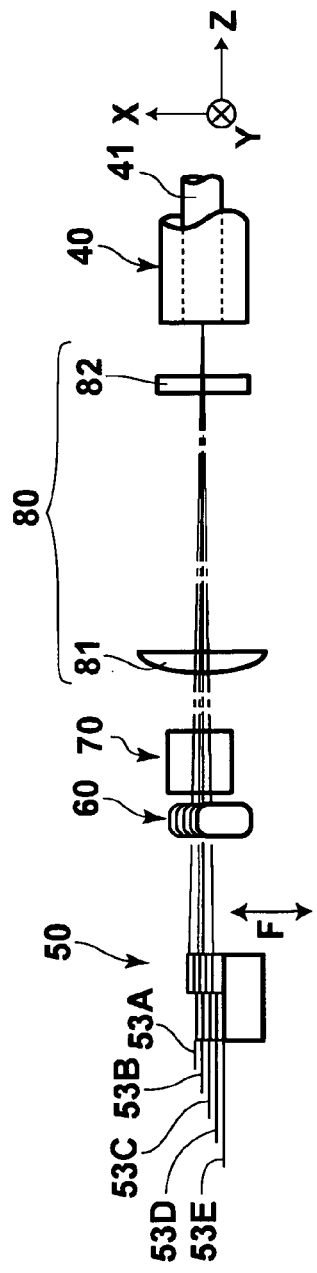

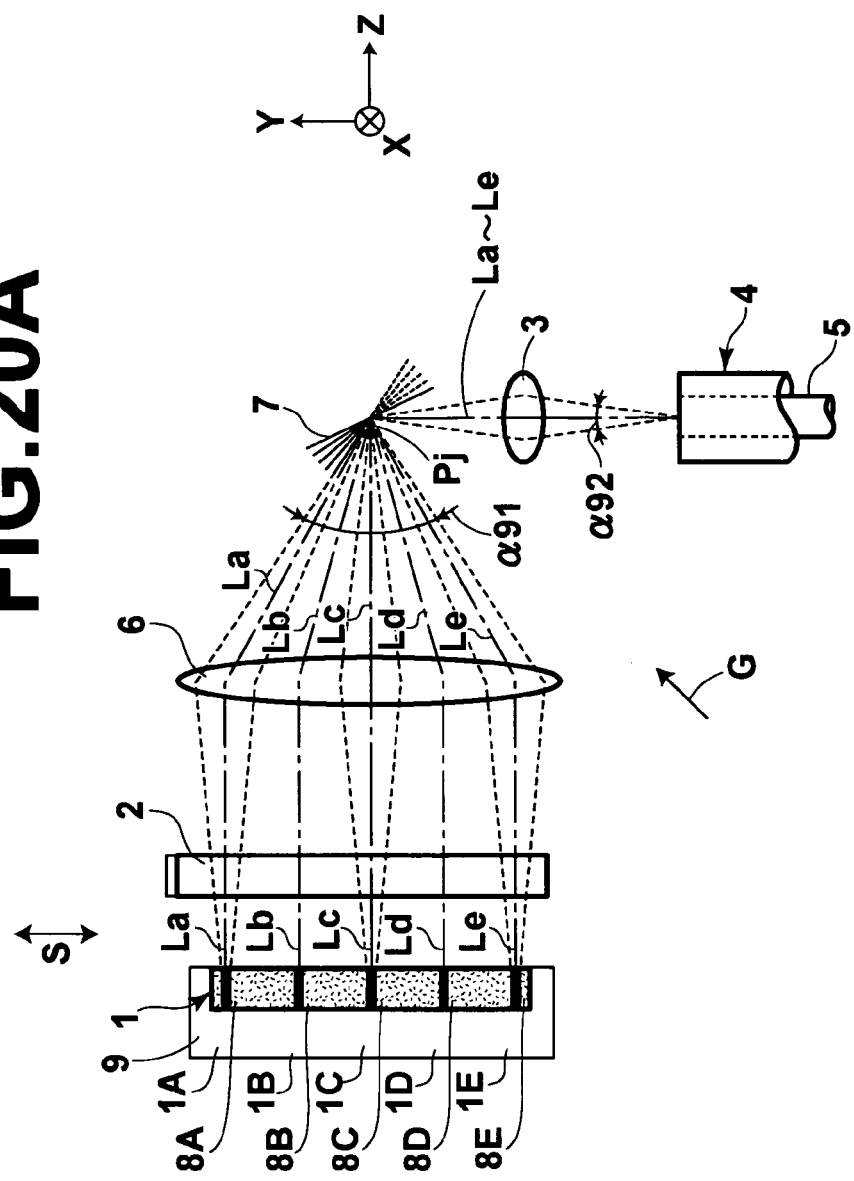
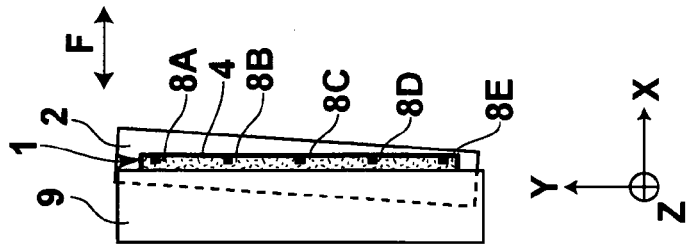

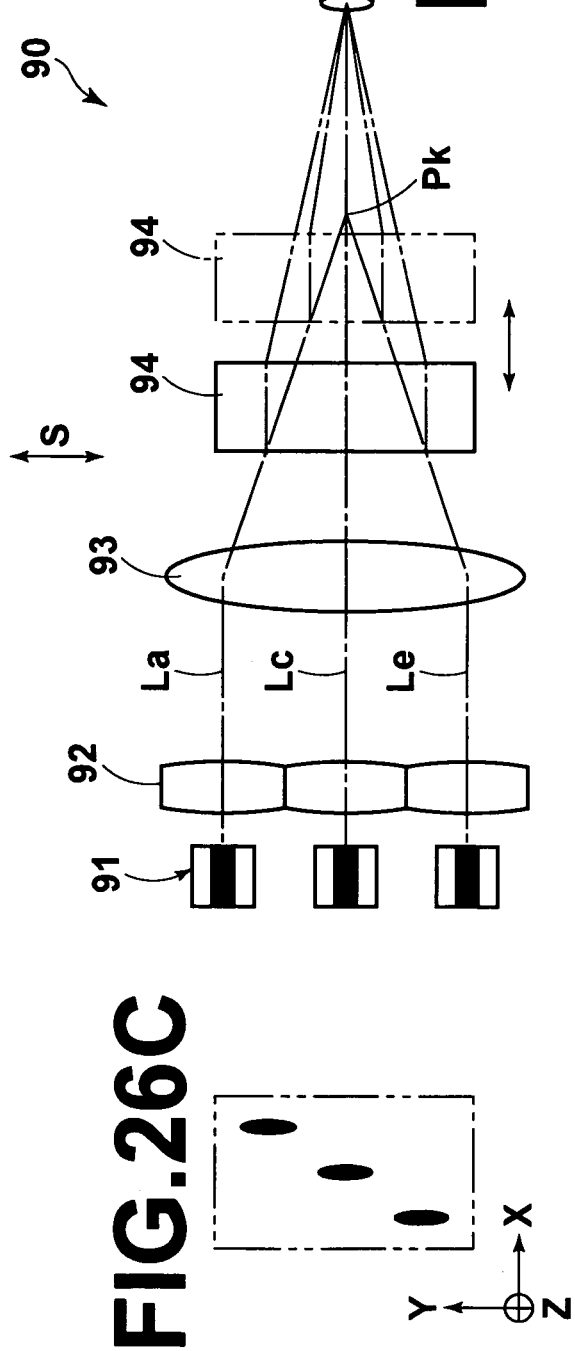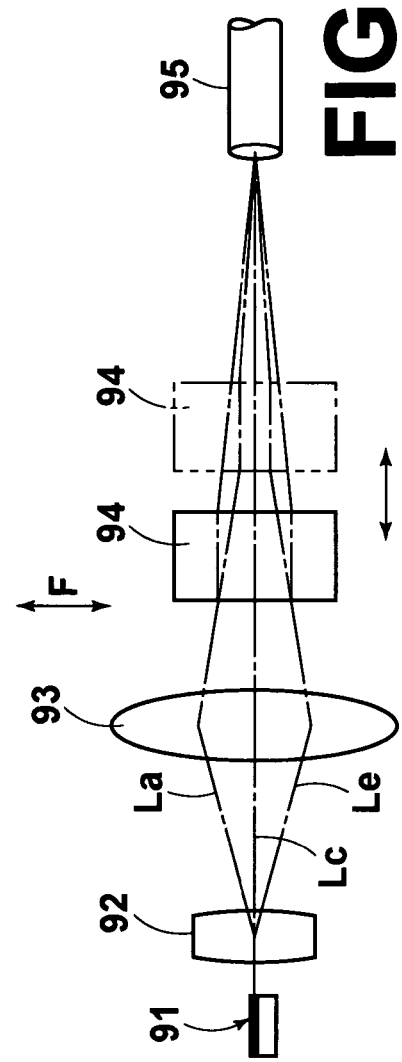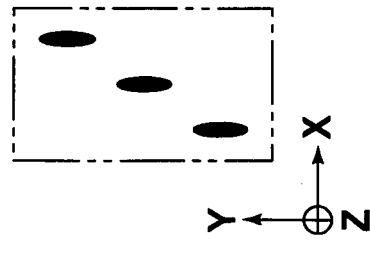

APPARATUS FOR SYNTHESIZING LASER BEAMS

BACKGROUND OF THE INVENTION

1. Field of the Invention

This invention relates to an apparatus for synthesizing laser beams, and more particularly to an apparatus for synthesizing laser beam bundles respectively radiated from a plurality of semiconductor lasers into a synthesized laser beam bundle and converging the synthesized laser beam bundle into optical fiber.

2. Description of the Related Art

There has been known a technology in which bundles of laser beams respectively radiated from a plurality of semiconductor lasers arranged in one direction are passed through a collimator lens into parallel beam bundles (having parallel optical axes) arranged in one direction, and the whole parallel beam bundles are condensed and introduced into a single optical fiber, whereby a laser beam of a high energy density is caused to propagate the optical fiber. See, for instance, U.S. Patent Laid-Open No. 20020090172.

In the technology, though the beam synthesizing efficiency (the efficiency of synthesizing the beam bundles radiated from a plurality of semiconductor lasers and introduced into a single optical fiber) is as high as 90%, the number of beams to be synthesized is limited since the angle of incidence of the beam bundle to the optical fiber is limited according to the numerical aperture (e.g., NA=0.2) of the optical fiber. That is, the power of the laser beams to be synthesized and introduced into the optical fiber is limited according to the numerical aperture of the optical fiber.

As a method of generating a plurality of laser beams having parallel optical axes, there has been known a technology which employs a plurality of semiconductor lasers arranged in one direction on one substrate. Since the active layers of the semiconductor lasers arranged in this way are arranged in flush with each other, the beam bundles radiated from semiconductor lasers arranged in this way having parallel slow axes in a plane. An assembly of a plurality of semiconductor lasers arranged in this way is sometimes referred to as "a laser bar", and the direction of widths of the active layers of the semiconductor lasers perpendicular to the direction of the slow axes is the direction of fast axis of each beam bundle.

As a system of concentrating the largest possible number of laser beam bundles within the range of the angle of incidence determined by the numerical apertures of the optical fiber and synthesizing the laser beam bundles in the optical fiber, there has been known the following synthesizing system. FIG. 20A is a plan view showing a laser beam synthesizing apparatus as seen from above, FIG. 20B is a left side view of the laser beam synthesizing apparatus as seen in the optical axis of the laser beam bundle, and FIGS. 21A and 21B are views for illustrating the angle of convergence where FIG. 21A is a view showing a state where the whole beam bundle comprising a plurality of beam bundles is converged and FIG. 21B is a view showing an intensity distribution in the direction of slow axis in the whole beam bundle.

In the synthesizing system, the whole beam bundle comprising a plurality of beam bundles La, Lb, Lc, . . . radiated in the direction of arrow Z from a laser bar 1 comprising a plurality of semiconductor lasers 1A, 1B, 1C, . . . arranged in the direction of arrow Y perpendicular to the direction of arrow Z is passed through a cylindrical lens 2 (to be described later) and then passed through a converging optical system 6 to converge the whole beam bundle at an angle of convergence of $\alpha 91$ so that the width of the whole beam bundle as measured in the direction of the slow axis (the direction of double-headed arrow S, equal to the direction of arrow Y in this particular embodiment) is reduced. Then the whole beam bundle is converged on a converging position Pj which comes to be a point on the Y-Z plane positioned on a redirection system 7, that is, beam bundles making up the whole beam bundle are focused in different positions in the converging position pj which is a linear area extending in the direction of arrow X (the direction of the fast axis shown by double-headed arrow F) on the redirection system 7. The beam bundles La, Lb, Lc, . . . emanates from the redirection system 7 after directed by the redirection system 7 so that their optical axes become parallel to each other and in alignment with each other as seen in the direction of the fast axis (the direction of double-headed arrow F, equal to the direction of arrow X in this particular embodiment). Then the whole beam bundle is passed through a condenser optical system 3 and is converged at an angle of convergence of $\alpha 92$ ($\alpha 92$ is smaller than $\alpha 91$, here). Then the converged whole beam bundle is introduced into the core 5 of the optical fiber 4. There has been known a method in which the largest possible number of laser beam bundles are synthesized in one optical fiber in this manner. See, for instance, U.S. Pat. No. 6,462,883.

The angle of convergence is defined as follows.

Figure 21A:
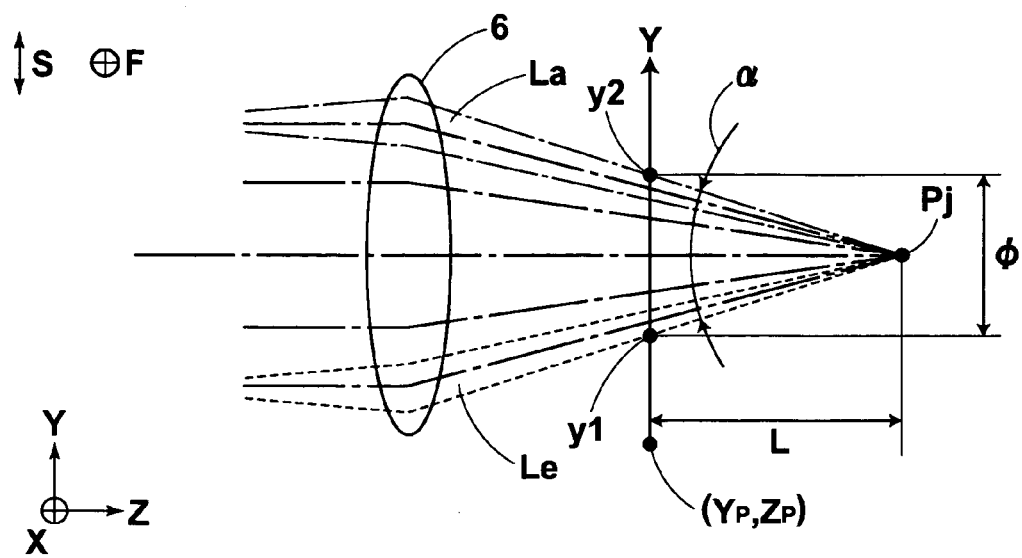
Figure 21B:
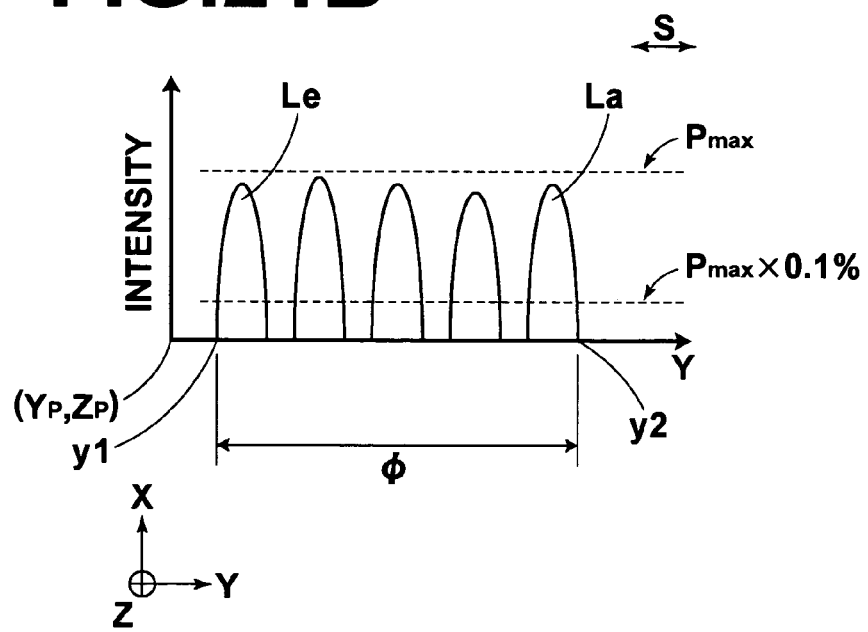

On the basis of a particular position, a position (Yp, Zp) shown in FIG. 21A here, an intensity distribution (See FIG. 21B) in the direction of the slow axis (the direction of arrow Y) in the whole beam bundle about to converge is obtained. Then positions where the intensity is 0.1% of the maximum Pmax of the intensity in the intensity distribution are determined in the intensity distribution, and then outermost positions y1 and y2 which are the outermost in the direction of the slow axis (direction of the arrow Y) in the positions are determined. The space p between the positions y1 and y2 is calculated.

Further, the distance L in the direction of optical axis (the direction of arrow Z) between the position (Yp, Zp) and the converging position Pj of the whole beam bundle is determined.

The angle of convergence $\alpha$ is defined by the following formula.

$$\tan(\alpha/2) = (\phi/2)/L = \phi/2L$$

The redirection system 7 can be formed by, for instance, superposing one on another in the direction of the fast axis a plurality of thin (small in thickness in the direction of arrow X or the direction of the fast axis) mirrors and one of the beam bundles La, Lb, Lc, . . . which are converged by the converging optical system 6 and are in different positions in the direction of arrow X is caused to impinge upon one of the mirrors, whereby the optical axes of the beam bundles are made to be aligned with each other as seen in the direction of the fast axis. "as seen in the direction of the fast axis" and "as seen in the direction of the slow axis" will be expressed "in the fast axis view" and "in the slow axis view", hereinbelow.

More specifically, the laser beam bundles La, Lb, Lc . . . which are radiated in the same direction from the active layers 8A, 8B, 8C . . . formed in a plane in the laser bar 1 and whose slow axes are parallel in a plane are passed through the cylindrical lens 2 whose cylindrical axis (an axis determined in the direction in which the cylindrical lens extends) is inclined to the slow axes, and offset in different positions in the direction of the fast axis with the slow axes of the laser beam bundles La, Lb, Lc . . . kept parallel to each other, and the offset laser beam bundles are introduced into the redirection system 7 through the converging optical system 6. That is, the whole beam bundle comprising the laser beam bundles La, Lb, Lc . . . offset in different positions in the direction of the fast axis by the cylindrical lens 2 is converged by the converging optical system 6 so that the width in the direction of the slow axis is reduced, and at the same time, the laser beam bundles La, Lb, Lc . . . are converged in both the directions of the slow axis and the fast axis and are introduced into the redirection system 7 in different positions in the direction of the fast axis. The laser bar 1 is disposed on a block 9.

The beam bundles La, Lb, Lc, . . . are converged by the converging optical system 6 so that the optical axes of the beam bundles intersect each other at the converging position Pj in the fast axis view (that is, in the YZ plane) and the beam bundles are condensed in the converging position Pj.

Introduction of the beam bundles La, Lb, LC . . . into the optical fiber 4 through the redirection system 7 will be described, hereinbelow.

Figure 22:
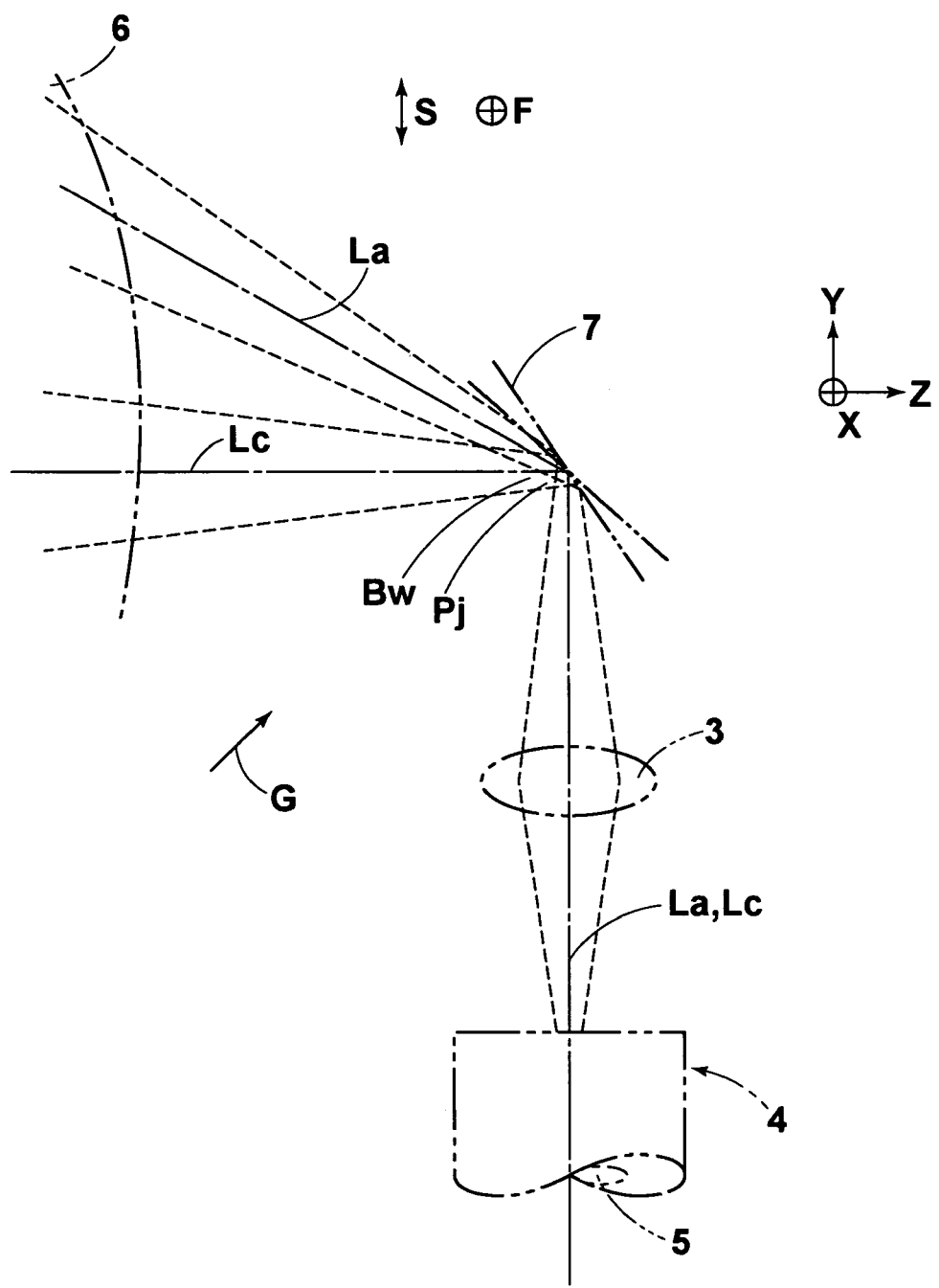
Figure 23:
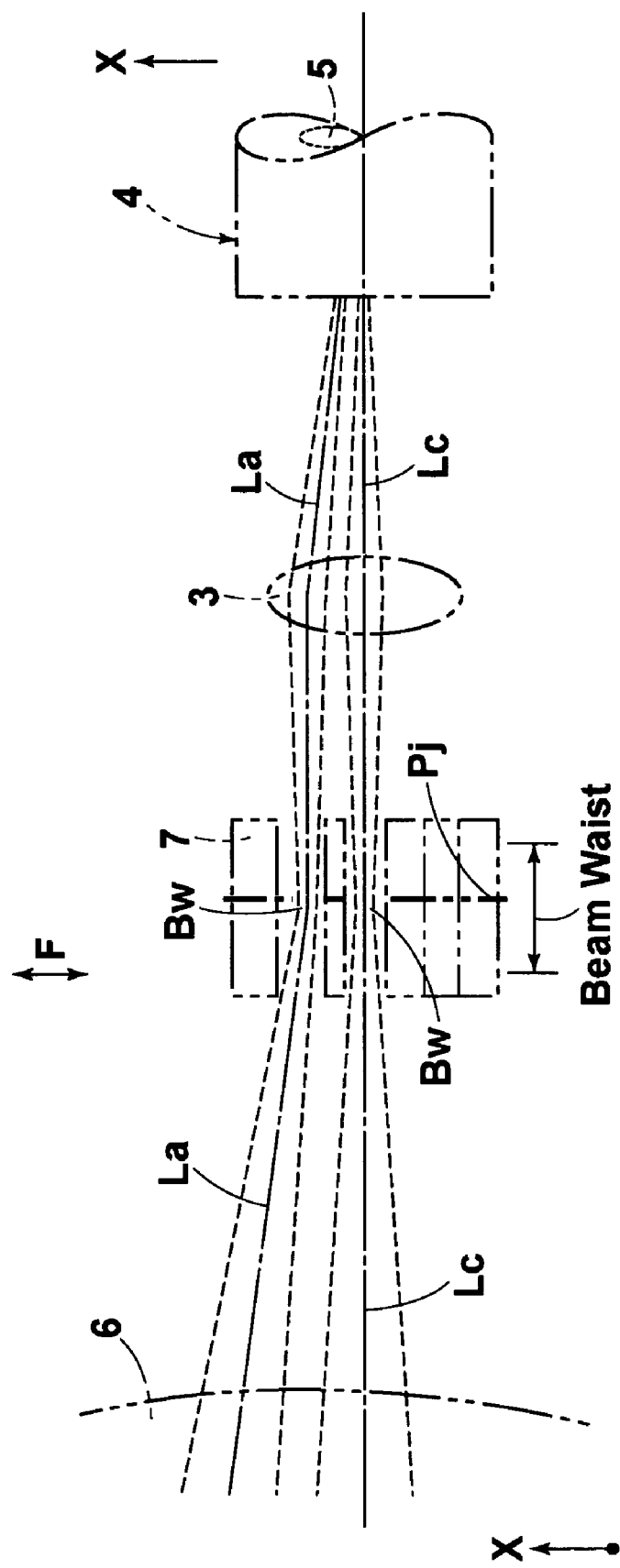
Figure 24A:
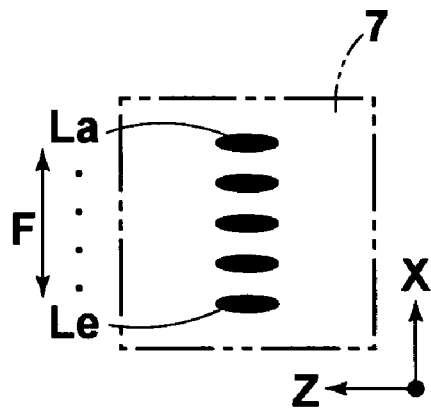
Figure 24B:
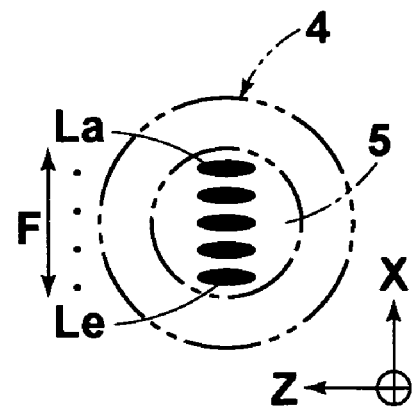
Figure 25A:
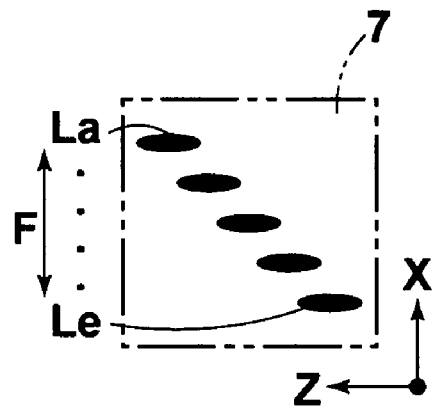
Figure 25B:
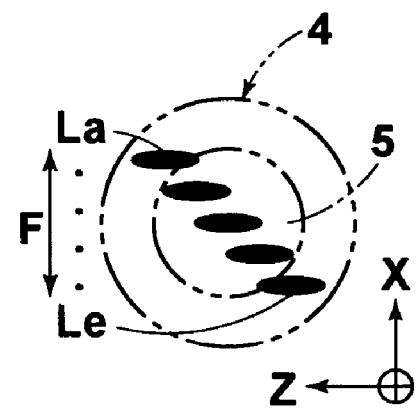

FIG. 22 is a plan view showing the optical axes and profiles of the beam bundles near the redirection system in an enlarged scale, FIG. 23 is a view seen in the direction of arrow G in FIGS. 20A and 20B or 22 showing the optical axes and profiles of the beam bundles near the redirection system in an enlarged scale, FIGS. 24A and 24B are views showing in an enlarged scale a state of the beam bundles emanating from the redirection system in a predetermined position to be described later and a state of the beam bundles introduced into the optical fiber as seen along the direction in which the beam bundles propagate, where FIG. 24A is a view showing a state of the beam bundles emanating from the redirection system and FIG. 24B is a view showing a state of the beam bundles introduced into the optical fiber, and FIGS. 25A and 25B are views for illustrating a state of the beam bundles when the redirection system is disposed out of the predetermined position as seen along the direction in which the beam bundles propagate where FIG. 25A is a view showing a state of the beam bundles emanating from the redirection system and FIG. 25B is a view showing a state of the beam bundles introduced into the optical fiber. In FIGS. 22 and 23, only the beam bundles La and Lc are shown and the other beam bundles Lb, Ld and Le are abbreviated.

As shown in FIGS. 22 and 23, the whole beam bundle is converged so that the converging position Pj is on the redirection system 7 and the beam waist of each beam bundle is on the redirection system 7. The redirection system 7 changes the direction of each beam bundle so that the optical axes of the beam bundles are aligned with each other in the fast axis view and radiates the beam bundles so that their optical axes are parallel to each other. Though the beam bundles radiated from the redirection system 7 subsequently diverge, the beam bundles are condensed again by the condenser optical system 3 and are introduced into the core 5 of the optical fiber A.

When the redirection system 7 is correctly disposed in a predetermined position as described above, the beam bundles radiated from the redirection system 7 are aligned with each other in the fast axis view and are linearly arranged as shown in FIG. 24A and the beam bundles introduced into the optical fiber 4 are also linearly arranged in the direction of the fast axis as shown in FIG. 24B.

On the other hand, when the redirection system 7 is disposed deviated from the predetermined position in the direction of arrow Z, the optical axes of the beam bundles radiated from the redirection system 7 are shifted in the fast axis view and are not linearly aligned with each other in the direction of the fast axis as shown in FIG. 25A, and the beam bundles introduced into the optical fiber 4 are not linearly aligned with each other in the direction of the fast axis but shifted from each other as shown in FIG. 25B. Accordingly, the beam bundles impinge upon a larger area of the end face of the optical fiber 4 as compared with when the optical axes of the beam bundles radiated from the redirection system 7 are linearly aligned with each other in the direction of the fast axis, and some of the beam bundles can impinge upon the end face of the optical fiber 4 outside the core 5. Accordingly, the coupling efficiency of the whole beam bundle to the optical fiber 4 deteriorates. In order to suppress the deterioration of the coupling efficiency, it is necessary to accurately dispose the redirection system 7 in a predetermined position in the direction of arrow Z.

As can be understood from the description above, it is necessary to accurately position and fix the redirection system in a very small space where a plurality of beam waists are concentrated and to produce the redirection system in a small size at a high accuracy to conform to the shape of each beam bundle. It is difficult to produce such a redirection system. Further, since the dimensions of the beam waist are proportional to the wavelength, as the dimensions of the beam waist become smaller with recent shortening the wavelengths of lasers, it becomes necessary that the redirection system is smaller in size and more accurately fixed, which makes it more difficult to produce the redirection system.

The laser beam synthesizing apparatus is for obtaining a laser beam bundle which is large in output (high in energy density) by synthesizing laser beams radiated from a plurality of semiconductor lasers since a small and large-output semiconductor laser is hard to realize, and accordingly, there has been a strong demand toward reduction of the size of the apparatus. For example, there has been a demand toward obtaining a laser beam synthesizing apparatus which is large in output for its size by reducing the size of the apparatus without reducing the output of the synthesized laser beam.

The system described above, where the whole beam bundle comprising laser beam bundles radiated from a plurality of semiconductor lasers and offset is converged and passed through a redirection system to align the propagating directions of the bundles with each other, and then the laser beam bundles are converged by a condenser optical system and introduced into the optical fiber to be synthesized into a synthesized bean bundle, is disadvantageous in that the optical path along which each of the beam bundles propagates from the semiconductor laser to the optical fiber is elongated, and at the same time, a number of optical parts including the lens for offsetting the beam bundles and the lens for converging the whole beam bundle must be disposed on the optical path, whereby the size of the apparatus is increased. Further, the system gives rise to a difficult problem that a smaller and more accurate redirection system must be provided as the wavelengths of the lasers are shortened.

Further, when the laser beam bundles radiated from a plurality of semiconductor lasers are offset by passing the laser beam bundles through a cylindrical lens whose axis is inclined to the slow axes of the beam bundles, the beam bundles passed through the periphery of the cylindrical lens become large in aberration. Since it is difficult to accurately converge the beam bundle having such a large aberration, e.g., to correctly introduce the beam bundle into the core (50 µm in diameter) of the optical fiber, the coupling efficiency deteriorates to, for instance, about 60%. In the case where a laser bar comprising an increased number of semiconductor lasers is used and an increased number of beam bundles are to be synthesized in an optical fiber in order to obtain a laser beam which is especially high in energy density, the length of the laser bar is increased and the offset must be increased, whereby the beam bundles passed through positions of the cylindrical lens largely deviated from the center of the cylindrical lens become large in aberration and it becomes difficult to obtain a high coupling efficiency.

Anyway, there is a problem that the range of incidence of laser beams which can be synthesized in a single optical fiber is limited by the numerical aperture NA of the optical fiber.

SUMMARY OF THE INVENTION

In view of the foregoing observations and description, the object of the present invention is to provide a laser beam synthesizing apparatus which is small in size and high in output. More specifically, a first object of the present invention is to provide a laser beam synthesizing apparatus which is high in output for its size by reducing the size of the apparatus, and a second object of the present invention is to provide a laser beam synthesizing apparatus which can suppress deterioration of the coupling efficiency of beam bundles to an optical fiber involved in increase of the number of the beam bundles to be synthesized.

In accordance with the present invention, there is provided a laser beam synthesizing method comprising the steps of offsetting in different positions in the direction of the fast axis a plurality of beam bundles radiated from a plurality of semiconductor lasers, converging the optical axes of the beam bundles in the fast axis view, and introducing the beam bundles into an end face of an optical fiber after converging them in the directions of the fast axis and the slow axis, wherein the improvement comprises the steps of disposing a convergent angle transforming optical system further upstream of the upstream-most position in the positions where the optical axes of the beam bundles converged in the fast axis view intersect each other in the fast axis view, passing the whole beam bundle made up of the beam bundles converged in the fast axis view through the convergent angle transforming optical system so that the angle of convergence of the whole beam bundle or part of the beam bundles making up the whole beam bundle is made smaller in the fast axis view, and introducing the whole beam bundle into the end face of the optical fiber.

In accordance with the present invention, there is further provided a first laser beam synthesizing apparatus which comprises a plurality of semiconductor lasers and in which a plurality of beam bundles radiated from the plurality of semiconductor lasers are offset in different positions in the direction of the fast axis, the optical axes of the beam bundles are converged in the fast axis view, and the beam bundles are introduced into an end face of an optical fiber after converging them in the directions of the fast axis and the slow axis, wherein the improvement comprises a convergent angle transforming optical system disposed further upstream of the upstream-most position in the positions where the optical axes of the beam bundles converged in the fast axis view intersect each other in the fast axis view, the convergent angle transforming optical system making smaller the angle of convergence in the fast axis view of the whole beam bundle made up of the beam bundles converged in the fast axis view and introducing the whole beam bundle into the end face of the optical fiber.

It is preferred that the first laser beam synthesizing apparatus further comprises a converging means which converges the beam bundles radiated from the plurality of semiconductor lasers in the directions of the fast and slow axes, wherein the converging means makes the exit angles in the slow axis view of the beam bundles emanating therefrom smaller than the radiation angles in the slow axis view of the beam bundles at which they are radiated from the respective semiconductor lasers.

The wavelengths of the beam bundles radiated from the plurality of semiconductor lasers may be in the range of not shorter than 350 nm and not longer than 460 nm. The laser beam synthesizing apparatus using a plurality of semiconductor lasers radiating beam bundles of such short wavelengths can collect the synthesized laser beam in a small spot, that is, can increase the energy density of the laser beam, and accordingly, is suitable for the laser material processing.

The system for offsetting in different positions in the direction of the fast axis radiated from a plurality of semiconductor lasers may be a system in which each of the beam bundles radiated from the semiconductor lasers is passed through an optical system so that the beam bundles are offset in the direction of the fast axis or a system in which the semiconductor lasers are disposed so that their active layers are positioned in different positions in the direction of thickness of the active layers and the beam bundles radiated from the semiconductor lasers are offset in different positions in the direction of the fast axis.

The system for converging the optical axes of the beam bundles in the fast axis view may be a system in which each of the beam bundles radiated from the semiconductor lasers is passed through an optical system so that the beam bundles are converged or a system in which the semiconductor lasers are disposed so that the optical axes of the beam bundles as radiated from the semiconductor lasers converge in the fast axis view.

The "upstream" means the side nearer to the light source (semiconductor laser) as seen along the optical path along which the beam bundles propagate.

The expression "in the fast axis view" means "when seen in the direction of the fast axis", and the expression "in the slow axis view" means "when seen in the direction of the slow axis".

The "angle of convergence" means an angle at which the whole beam bundle sees the direction of convergence when the converging whole beam bundle is seen in the fast axis view and the angle of convergence is represented by an angle α in FIGS. 21A and 21B described above.

In accordance with the present invention, there is further provided a second laser beam synthesizing apparatus which comprises a laser block, a converging/dispersion optical system and a convergent angle transforming optical system, the laser block being a block in which a plurality of semiconductor lasers are arranged so that their active layers are arranged in a plane and radiating beam bundles having parallel slow axes in the plane, the converging/dispersion optical system comprising converging/dispersion lens elements disposed in correspondence with each of the beam bundles radiated from the semiconductor lasers, converging the whole beam bundle made up of the beam bundles so that the width in the direction of the slow axis of the whole beam bundle is narrowed, offsetting the beam bundles in different positions in the direction of the fast axis, converging the beam bundles in the directions of the respective fast and slow axes and introducing the beam bundles into the convergent angle transforming optical system in predetermined positions different from each other in the direction of the respective fast axes, and the convergent angle transforming optical system being disposed further upstream of the upstream-most position in the positions where the optical axes of the beam bundles intersect each other in the fast axis view, making smaller the angle of convergence of the whole beam bundle than the angle of convergence when the whole beam bundle is radiated from the converging/dispersion optical system and then introducing the whole beam bundle into an optical fiber.

The converging/dispersion optical system may be an optical system comprising converging/dispersion lens elements which are disposed in correspondence with each of the beam bundles radiated from the semiconductor lasers and has both functions to offset the beam bundles in different positions in the direction of the fast axis and to converge the whole beam bundle made up of the beam bundles so that the width in the direction of the slow axis of the whole beam bundle is narrowed and converge the beam bundles in the directions of the respective fast and slow axes.

It is preferred that the converging/dispersion lens elements form a truncate type lens.

The converging/dispersion optical system may comprise an offset optical system which are disposed in correspondence with each of the beam bundles and has a function to offset the beam bundles in different positions in the direction of the fast axis and a condenser optical system having a function to converge the whole beam bundle made up of the beam bundles radiated from the offset optical system so that the width in the direction of the slow axis of the whole beam bundle is narrowed, converge the beam bundles in the directions of the respective fast and slow axes and then introduce the beam bundles into the convergent angle transforming optical system in predetermined positions different from each other in the direction of the respective fast axes.

It is preferred that the offset optical system comprises a truncate type lens.

The plurality of semiconductor lasers may be separated from each other.

At least two of the plurality of semiconductor lasers may be integrated.

The converging/dispersion optical system and the convergent angle transforming optical system need not be clearly separated in their functions but each may perform a part of the function of the other. For example, the convergent angle transforming optical system may carry a part of the function of the converging/dispersion optical system to converge the whole beam bundle so that the width in the direction of the fast axis of the whole beam bundle is narrowed and/or to converge the whole beam bundle so that the width in the direction of the slow axis of the whole beam bundle is narrowed.

In accordance with the present invention, there is further provided a third laser beam synthesizing apparatus which comprises a laser block, a whole converging optical system and a convergent angle transforming optical system, the laser block being a block in which a plurality of semiconductor lasers are arranged so that their active layers are positioned in different positions in the direction of thickness of the active layers in parallel to each other and radiating beam bundles having slow axes parallel to each other, the whole converging optical system being an optical system which converges the whole beam bundle, made up of the beam bundles having slow axes parallel to each other and radiated from the plurality of semiconductor lasers, so that the width in the direction of the slow axis of the whole beam bundle is narrowed, converging the beam bundles in the directions of the respective fast and slow axes and introducing the beam bundles into the convergent angle transforming optical system in predetermined positions different from each other in the direction of the respective fast axes, and the convergent angle transforming optical system being disposed further upstream of the upstream-most position in the positions where the optical axes of the beam bundles intersect each other in the fast axis view, making smaller the angle of convergence of the whole beam bundle than the angle of convergence when the whole beam bundle is radiated from the whole converging optical system and then introducing the whole beam bundle into an optical fiber.

The whole converging optical system may be an optical system which directly converges the whole beam bundle made up of the beam bundles so that the width in the direction of the slow axis of the whole beam bundle is narrowed, converges the beam bundles in the directions of the respective fast and slow axes and then introduces the beam bundles into the convergent angle transforming optical system in predetermined positions different from each other in the direction of the respective fast axes.

It is preferred that the whole converging optical system comprises a truncate type lens.

The whole converging optical system may comprise collimator optical systems which are disposed in correspondence with the beam bundles to make parallel each of the beam bundles and a condenser optical system which converges the whole parallel beam bundles so that the width in the direction of the slow axis is narrowed, converges the beam bundles in the directions of the respective fast and slow axes and then introduces the beam bundles into the convergent angle transforming optical system in predetermined positions different from each other in the direction of the respective fast axes.

It is preferred that the collimator optical system comprises a truncate type lens.

The whole converging optical system and the convergent angle transforming optical system need not be clearly separated in their functions but the convergent angle transforming optical system may perform a part of the function of the whole converging optical system. For example, the convergent angle transforming optical system may carry the function of the whole converging optical system to converge the whole beam bundle so that the width in the direction of the fast axis of the whole beam bundle is narrowed.

In accordance with the present invention, there is further provided a fourth laser beam synthesizing apparatus which comprises a laser block in which a plurality of semiconductor lasers are arranged so that their active layers are disposed in different positions in the direction of thickness of the active layers in parallel to each other and which radiates a plurality of beam bundles having slow axes parallel to each other and optical axes parallel to each other, a collimator optical system which makes parallel each of the beam bundles radiated from the plurality of semiconductor lasers, an optical axis shift optical system which shifts the beam bundles, passing through the collimator optical system, in the direction of slow axis of the beam bundle so that the optical axes of the beam bundles are arranged in a plane perpendicular to the slow axis, and a converging optical system which converges the whole beam bundle, made up of the beam bundles whose optical axes are arranged in the plane, in the directions of the fast and slow axes and then introduces the whole beam bundle into an optical fiber.

It is preferred that the collimator optical system comprises a truncate type lens.

The collimator optical system, the optical axis shift optical system and the converging optical system need not be clearly separated in their functions but each may perform a part of the function of the others. For example, the optical axis shift optical system may carry a part of the function to converge the whole beam bundle so that the width in the direction of the fast axis is narrowed or the collimator optical system may carry a part of the function to converge the whole beam bundle so that the width in the direction of the slow axis is narrowed.

The laser beam synthesizing apparatuses of the present invention may further comprise an additional semiconductor laser other than the plurality of semiconductor lasers and a polarization-synthesizing means which polarization-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

The "polarization-synthesis" means "to synthesize beam bundles different in polarization direction by the use of the nature of polarization".

The laser beam synthesizing apparatuses of the present invention may further comprise an additional semiconductor laser other than the plurality of semiconductor lasers and a wavelength-synthesizing means which wavelength-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

The "wavelength-synthesis" means "to synthesize beam bundles different in wavelength by the use of the difference in wavelength".

The laser beam synthesizing apparatuses may be used to excite a medium of a solid state laser or a fiber laser by the synthesized beam bundle made up of the beam bundles introduced into the optical fiber and synthesized therein.

Further, the laser beam synthesizing apparatuses may be used to directly excite a medium of a solid state laser or a fiber laser by the whole beam bundle radiated from the convergent angle transforming optical system.

The synthesized beam bundle may be an infrared beam and the medium may include at least one of rare earth elements $Nd^{3+}$ and $Yb^{3+}$.

The synthesized beam bundle may be 350 nm to 460 nm in wavelength with the medium including at least one of rare earth elements $Pr^{3+}$, $Er^{3+}$ and $Ho^{3+}$.

The expression "offsetting in different positions in the direction of the fast axis a plurality of beam bundles" means "to position the beam bundles in different positions in the slow axis view".

Said "truncate type lens" is a lens system in which a plurality of lens elements are arranged in a direction intersecting the optical axis of the lens with each of the lens elements cut to be shorter in the direction in which the lens elements are arranged so that a larger number of lens elements can be arranged in a given dimension.

Said "convergent angle transforming optical system" may comprise one of a reflecting surface, a refractive surface, a grating and a photonics crystal. For example, in the case where the convergent angle transforming optical system comprises a plurality of overlapping thin prisms upon which each of the beam bundles impinges, each prism may be provided with a reflecting surface, a refractive surface or a grating surface or may be formed of a photonics crystal.

In accordance with the laser beam synthesizing method and the first laser beam synthesizing apparatus of the present invention, since a convergent angle transforming optical system is disposed further upstream of the upstream-most position in the positions where the optical axes of the beam bundles converged in the fast axis view intersect each other in the fast axis view, the whole beam bundle made up of the beam bundles converged in the fast axis view is passed through the convergent angle transforming optical system to make smaller the angle of convergence in the fast axis view and then the whole beam bundle is introduced into the end face of the optical fiber the convergent angle transforming optical system which is a redirection system can be disposed nearer to the light source or the semiconductor lasers, and at the same time, the number of beam bundles which can be synthesized in one optical fiber can be increased. Further, since it is unnecessary to provide an optical system or the like for converging the beam bundles downstream of the redirection system unlike in the prior art, the length of the optical path from the semiconductor lasers radiating the beam bundles to the inlet end face of the optical fiber can be shortened, whereby the overall size of the apparatus can be reduced and a laser beam synthesizing apparatus which is high in output and small in size can be provided.

For example, as shown in FIGS. 26A and 26B, which are respectively a plan view and a front view for briefly illustrating the laser beam synthesizing method and the first laser beam synthesizing apparatus of the present invention, in a laser beam synthesizing apparatus 90 where beam bundles La, Lc and Le radiated from a plurality of semiconductor lasers 91 are offset by an offset means 92, converged by a converging optical system 93, and then introduced into an inlet end face of an optical fiber 95 through a convergent angle transforming optical system 94, the convergent angle transforming optical system 94 is disposed further upstream of the upstream-most position Pk in the positions where the optical axes of beam bundles La, Lc and Le converged by the converging optical system 93 intersect each other in the fast axis view.

In the prior art, the beam waists of the bundles are located in the positions where the optical axes of beam bundles intersect each other, and the redirection system is disposed in a predetermined position where the optical axes of beam bundles intersect each other and at the same time, the beam waist of each of the beam bundles exists. On the other hand, in accordance with the present invention, the convergent angle transforming optical system 94 may be disposed in any position in the direction of the optical axis (the direction of arrow Z in FIGS. 26A and 26B) between the converging optical system 93 and the position Pk, whereby the overall size of the apparatus can be reduced and the freedom in layout of parts in producing the apparatus can be increased.

For example, when it is desired that the convergent angle transforming optical system may be large in size, the large convergent angle transforming optical system may be disposed in a position in an upstream side between the converging optical system and the optical fiber where the space between the bundles widens. On the other hand, when it is desired that the convergent angle transforming optical system be small in size and precise, the convergent angle transforming optical system may be disposed in a position in a downstream side between the converging optical system and the optical fiber where the space between the bundles narrows. In the prior art, only a convergent angle transforming optical system which is small in size and precise can be used.

As shown in FIG. 26C, which is a left side view (seen in the direction of arrow Z in FIG. 26A) for illustrating beam bundles passing through the convergent angle transforming optical system, the beam bundles passing through the convergent angle transforming optical system are not linearly aligned with each other in the direction of the fast axis and accordingly the space between the beam bundles are wide, whereby the degree of freedom in production of the convergent angle transforming optical system is increased and production of the convergent angle transforming optical system is facilitated.

When the converging means makes the exit angles in the slow axis view of the beam bundles emanating therefrom smaller than the radiation angles in the slow axis view of the beam bundles at which they are radiated from the respective semiconductor lasers, the angle of incidence of the beam bundles introduced into the optical fiber can be made smaller, and accordingly, the amount of light introduced into the optical fiber within the range of incidence determined by the numerical aperture NA of the optical fiber can be increased, whereby the amount of light which can be synthesized in the optical fiber can be increased.

Further, when the wavelengths of the beam bundles radiated from the plurality of semiconductor lasers are in the range of not shorter than 350 nm and not longer than 460 nm, the optical members which can be employed in the apparatus are significantly limited, and when the limited optical members are employed, the degree of freedom of the parts layout in production of the apparatus is increased and production of the apparatus is facilitated. Further, the laser beam synthesizing apparatus using a plurality of semiconductor lasers radiating beam bundles of such short wavelengths can collect the synthesized laser beam in a small spot, that is, can increase the energy density of the laser beam, and accordingly, is suitable for the laser material processing.

These inventors investigated various systems of resolving the problem to reduce the size of a laser beam synthesizing apparatus having a laser block which is a block in which a plurality of semiconductor lasers are arranged so that their active layers are arranged in a plane and radiates beam bundles having parallel slow axes in a plane, by shortening the optical paths of the beam bundles to be synthesized into an integrated beam bundle. As a result, these inventors came to have recognition that a plurality of functions including those to offset the beam bundles and/or to converge the beam bundles and the whole beam bundle can be carried by a single optical member. On the basis of such recognition, these inventors have invented the second laser beam synthesizing apparatus.

In accordance with the second laser beam synthesizing apparatus of the present invention, since a convergent angle transforming optical system which makes smaller the angle of convergence of the whole beam bundle than the angle of convergence when the whole beam bundle is radiated from the converging/dispersion optical system and then introduces the whole beam bundle into an optical fiber is provided and the convergent angle transforming optical system is disposed further upstream of the upstream-most position in the positions where the optical axes of the beam bundles intersect each other in the fast axis view, a laser beam synthesizing apparatus which is high in output and small in size can be provided as in the first laser beam synthesizing apparatus. Further when the converging/dispersion optical system is arranged by optical systems each having a plurality of functions in the functions to be carried by the converging/dispersion optical system, e.g. to collimate the beam bundle, to offset the beam bundles, to converge the beam bundles and to converge the optical axes of the beam bundles, the length of the optical path can be shortened, whereby the overall size of the apparatus can be further reduced.

Further, when the converging/dispersion optical system comprises converging/dispersion lens elements disposed in correspondence with each of the beam bundles radiated from the semiconductor lasers to offset the beam bundles in different positions in the direction of the fast axis, converge the whole beam bundle made up of the beam bundles so that the width in the direction of the slow axis of the whole beam bundle is narrowed, and converge the beam bundles in the directions of the respective fast and slow axes, the beam bundles radiated from the semiconductor lasers can be synthesized in the optical fiber without separately providing an optical system for offsetting the beam bundles and an optical system for converging the beam bundles, whereby the length of the optical path can be more surely shortened and the number of optical members and the like to be positioned in the optical path can be reduced. Accordingly, the overall size of the apparatus can be more surely reduced.

Further, when the converging/dispersion optical system comprises an offset optical system which are disposed in correspondence with each of the beam bundles and has a function to offset the beam bundles in different positions in the direction of the fast axis and a condenser optical system having a function to converge the whole beam bundle made up of the beam bundles radiated from the offset optical system so that the width in the direction of the slow axis of the whole beam bundle is narrowed, converge the beam bundles in the directions of the respective fast and slow axes and then introduce the beam bundles into the convergent angle transforming optical system in predetermined positions different from each other in the direction of the respective fast axes, the beam bundles radiated from the semiconductor lasers can be synthesized in the optical fiber without separately providing an optical system for converging the optical axes of the beam bundles and an optical system for converging the beam bundles, whereby the length of the optical path can be more surely shortened and the number of optical members and the like to be positioned in the optical path can be reduced. Accordingly, the overall size of the apparatus can be more surely reduced.

Further, when the converging/dispersion lens elements comprise truncate type lenses and/or the offset optical system comprises a truncate type lens, the beam bundles each of which is ellipsoidal in cross-section, that is, small in diameter in the direction of the slow axis and large in diameter in the direction of the fast axis can be just passed through the truncate type lens elements, whereby the beam bundles can be efficiently passed through the lens elements and the spaces between the beam bundles can be reduced. Accordingly, the apparatus can be further smaller in size and higher in output power.

When the plurality of semiconductor lasers are separated from each other, the center of the semiconductor laser and the center of the optical system can be aligned only by adjusting the position of the semiconductor laser, whereby the degree of freedom in adjustment of the optical axis is increased and centering of the semiconductor laser with respect to the optical system is facilitated, which results in higher coupling efficiency of the beam bundles to the optical fiber. At the same time, influence of heat from one semiconductor laser on the other semiconductor laser can be suppressed and oscillation of the semiconductor lasers can be stabilized.

When at least two of the plurality of semiconductor lasers are integrated, the semiconductor lasers can be provided as a laser bar and the packing density of the semiconductor lasers can be increased.

In accordance with the third laser beam synthesizing apparatus of the present invention, since a convergent angle transforming optical system which makes smaller the angle of convergence of the whole beam bundle than the angle of convergence when the whole beam bundle is radiated from the whole converging optical system and then introduces the whole beam bundle into an optical fiber is provided and the convergent angle transforming optical system is disposed further upstream of the upstream-most position in the positions where the optical axes of the beam bundles intersect each other in the fast axis view, a laser beam synthesizing apparatus which is high in output and small in size can be provided as in the first laser beam synthesizing apparatus. Further, since the laser block is a block in which a plurality of semiconductor lasers are arranged so that their active layers are positioned in different positions in the direction of thickness of the active layers in parallel to each other and radiates beam bundles having slow axes parallel to each other, beam bundles whose slow axes are parallel to each other and are in different positions in the direction of the fast axis, that is, beam bundles offset from each other in the direction of the fast axis, can be generated without deteriorating the aberration of the beam bundles without use of a means for increasing the aberration of the beam bundles, for instance, by inserting a cylindrical lens inclined with respect to the slow axis, whereby beam bundles which are less in aberration for the amount of offset can be accurately introduced into the optical fiber, and deterioration of coupling efficiency of each of the beam bundles to the optical fiber with increase in the number of the beam bundles to be synthesized can be suppressed. Further, since an optical system for offsetting beam bundles radiated from the plurality of semiconductor lasers can be abbreviated, the apparatus can be small in size.

Further, when the whole converging optical system is an optical system which directly converges the whole beam bundle made up of the beam bundles so that the width in the direction of the slow axis of the whole beam bundle is narrowed, converges the beam bundles in the directions of the respective fast and slow axes and then introduces the beam bundles into the convergent angle transforming optical system in predetermined positions different from each other in the direction of the respective fast axes, the beam bundles can be introduced into the optical fiber without disposing an optical system for, for instance, collimating the beam bundles between the semiconductor lasers and the whole converging optical system, whereby the length of the optical path from the semiconductor lasers to the inlet end face of the optical fiber can be shortened, and the overall size of the apparatus can be further reduced.

When the whole converging optical system comprises collimator optical systems which are disposed in correspondence with the beam bundles to make parallel each of the beam bundles and a condenser optical system which converges the whole parallel beam bundles so that the width in the direction of the slow axis is narrowed, converges the beam bundles in the directions of the respective fast and slow axes and then introduces the beam bundles into the convergent angle transforming optical system in predetermined positions different from each other in the direction of the respective fast axes, the beam bundles can be introduced into the optical fiber without separately disposing, for instance, an optical system for converging the whole beam bundle and separately converging the beam bundles in the optical path, whereby the length of the optical path from the semiconductor lasers to the inlet end face of the optical fiber can be shortened, and the overall size of the apparatus can be further reduced.

Further, when the whole converging optical system comprises truncate type lenses and/or the collimator optical system comprises a truncate type lens, the beam bundles each of which is ellipsoidal in cross-section, that is, small in diameter in the direction of the slow axis and large in diameter in the direction of the fast axis can be just passed through the truncate type lens elements, whereby the beam bundles can be efficiently passed through the lens elements and the spaces between the beam bundles can be reduced. Accordingly, the apparatus can be further smaller in size and higher in output power.

In accordance with the fourth laser beam synthesizing apparatus of the present invention, since the laser block is a laser block in which a plurality of semiconductor lasers are arranged so that they radiate a plurality of beam bundles having slow axes parallel to each other and optical axes parallel to each other, beam bundles offset from each other in the direction of the fast axis can be generated without increasing the aberration of the beam bundles as in the third laser beam converging apparatus and beam bundles which are less in aberration for the amount of offset can be accurately introduced into the optical fiber, and deterioration of coupling efficiency of each of the beam bundles to the optical fiber with increase in the number of the beam bundles to be synthesized can be suppressed. Further, since an optical system for offsetting beam bundles radiated from the plurality of semiconductor lasers can be abbreviated, the apparatus can be small in size.

Further, when the collimator optical system comprises a truncate type lens, the beam bundles can be efficiently passed through the lens elements as described above and the spaces between the beam bundles can be reduced. Accordingly, the apparatus can be further smaller in size and higher in output power.

When provided with a polarization-synthesizing means or a wavelength-synthesizing means so that beam bundles radiated from additional semiconductor lasers are introduced into the optical fiber together with the beam bundles radiated from said plurality of semiconductor lasers, the output of the laser beam synthesized in the optical fiber can be more high.

Further, when the laser beam synthesizing apparatus is used to excite a medium of a solid state laser or a fiber laser by the synthesized beam bundle synthesized in the optical fiber, a laser beam which has a desired wavelength and is high in output can be obtained.

Further, when the laser beam synthesizing apparatus is used to directly excite a medium of a solid state laser or a fiber laser by the whole beam bundle radiated from the convergent angle transforming optical system, a laser beam which has a desired wavelength and is high in output can be obtained.

BRIEF DESCRIPTION OF THE DRAWINNGS

Figure 3A:
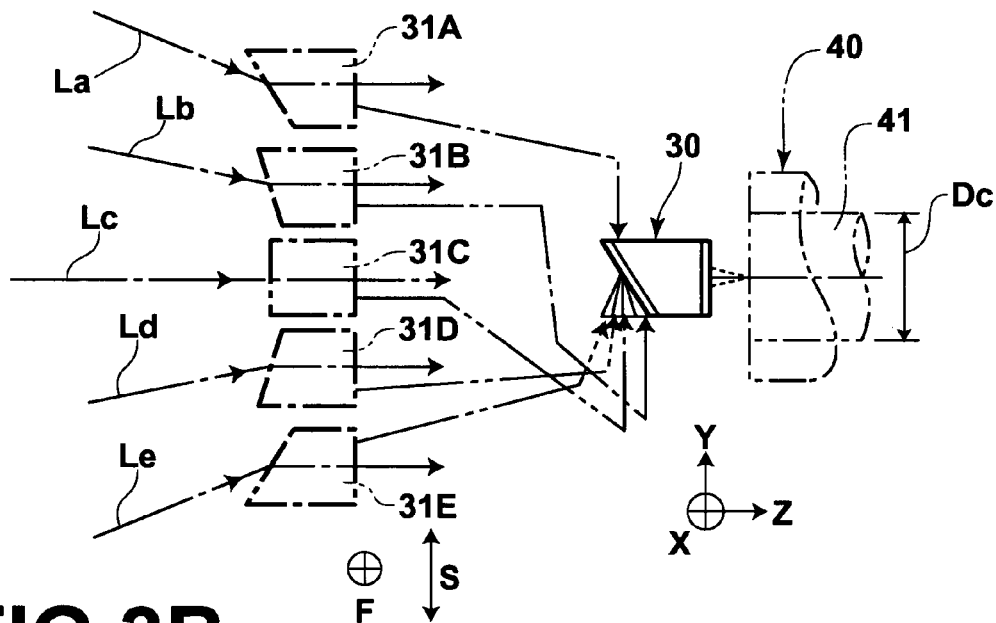
Figure 3B:
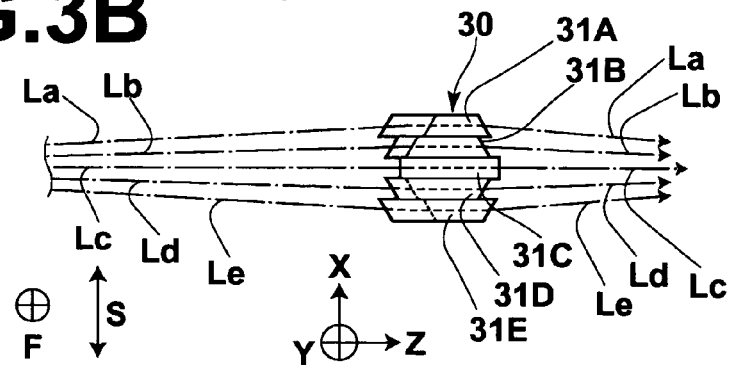
Figure 4A:
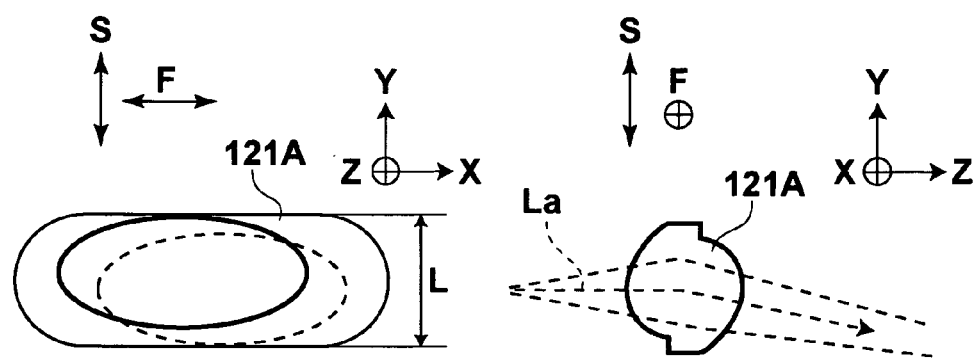
Figure 4B:
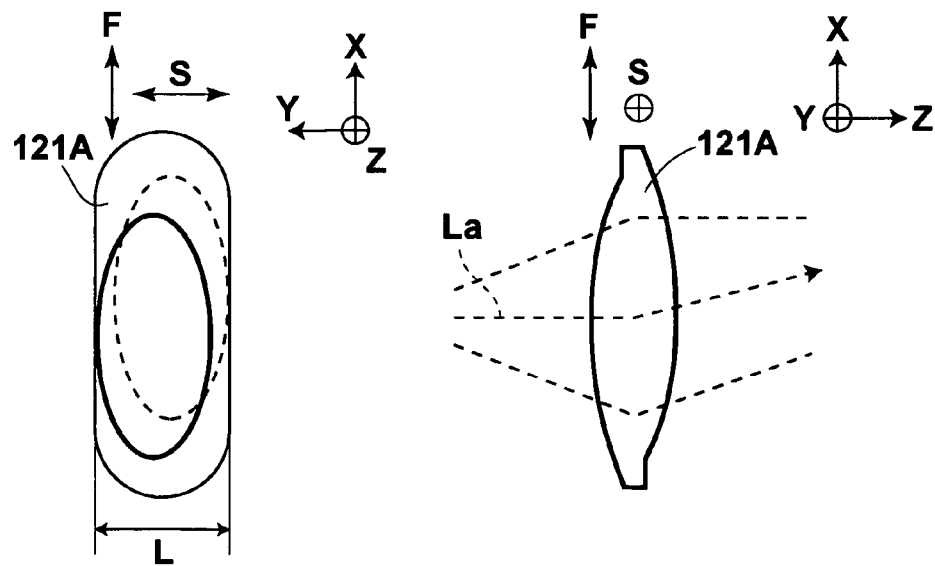
Figure 6A:
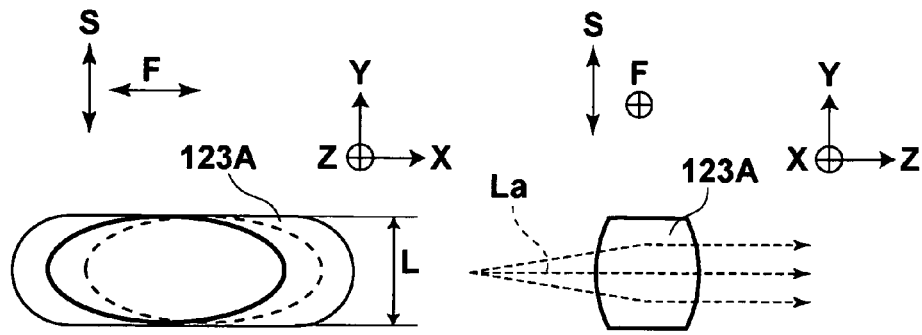
Figure 6B:
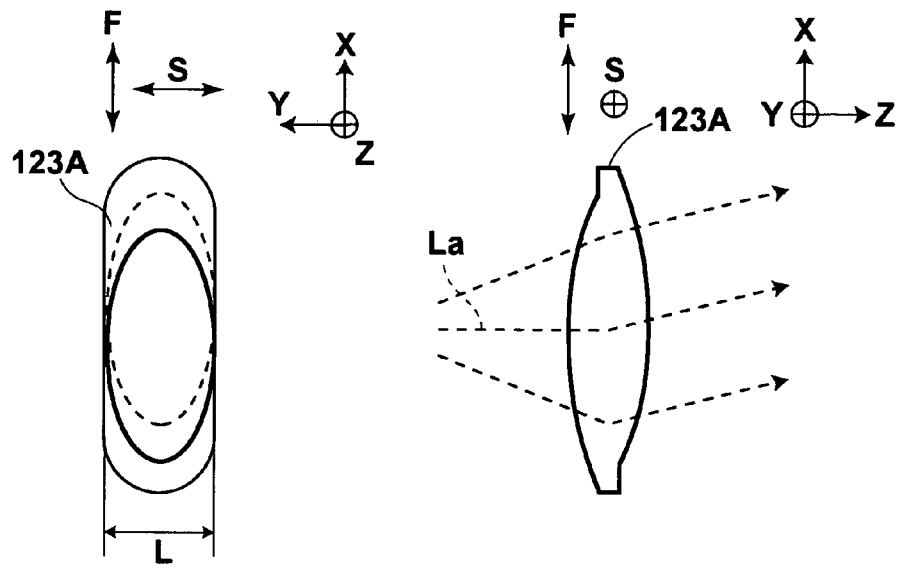
Figure 7:
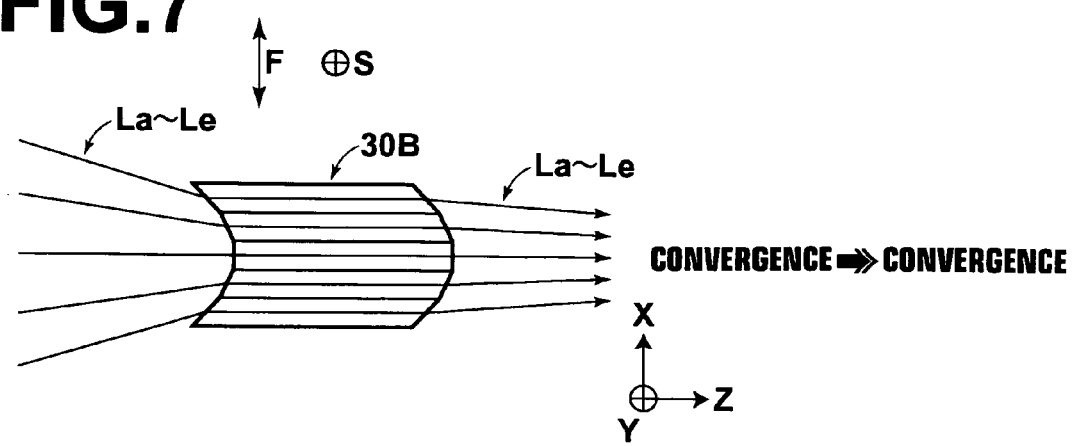
Figures 8A, 8B, 8C:
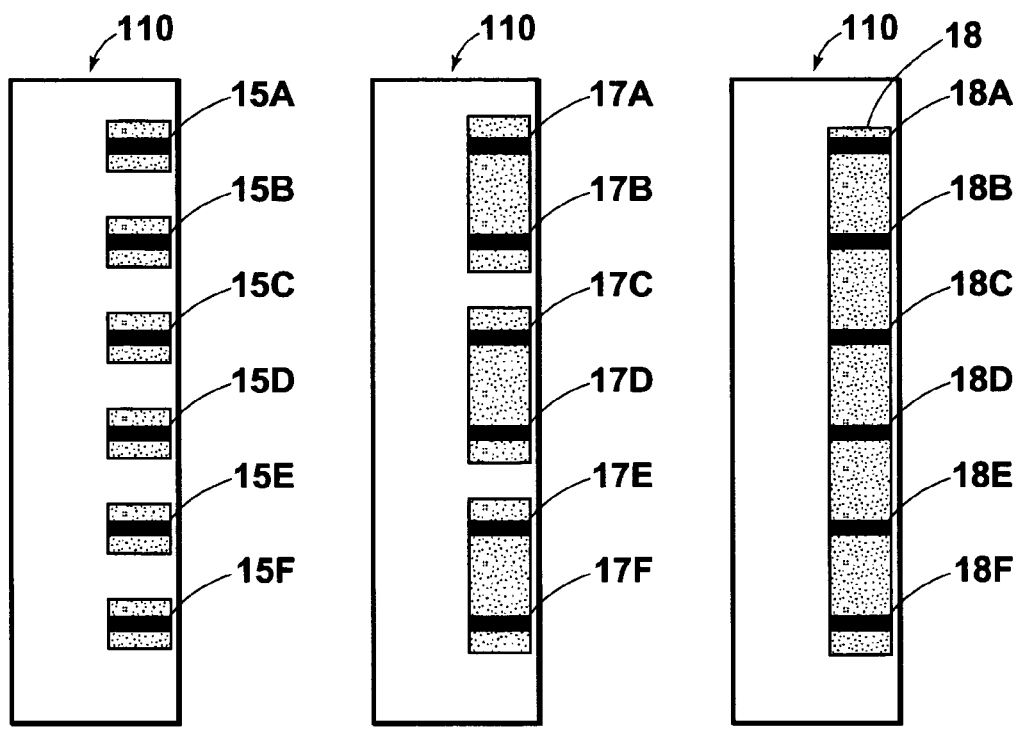
Figure 10:
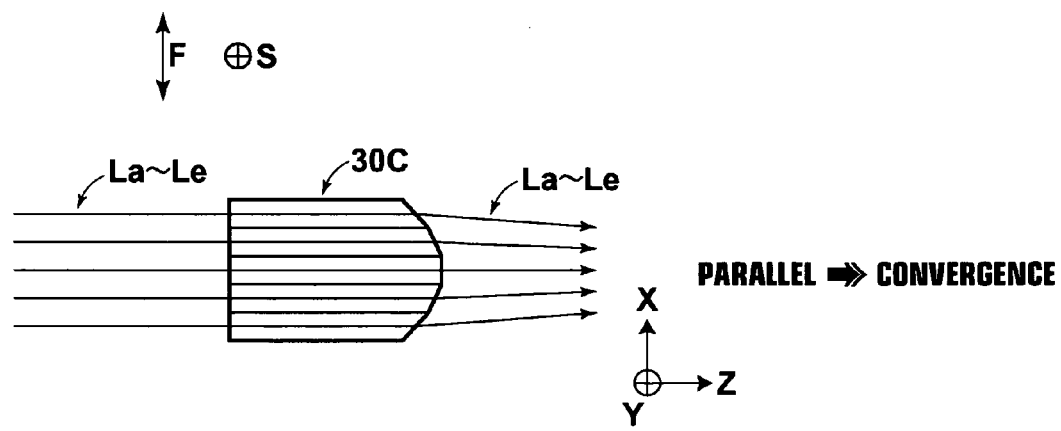
Figure 11:
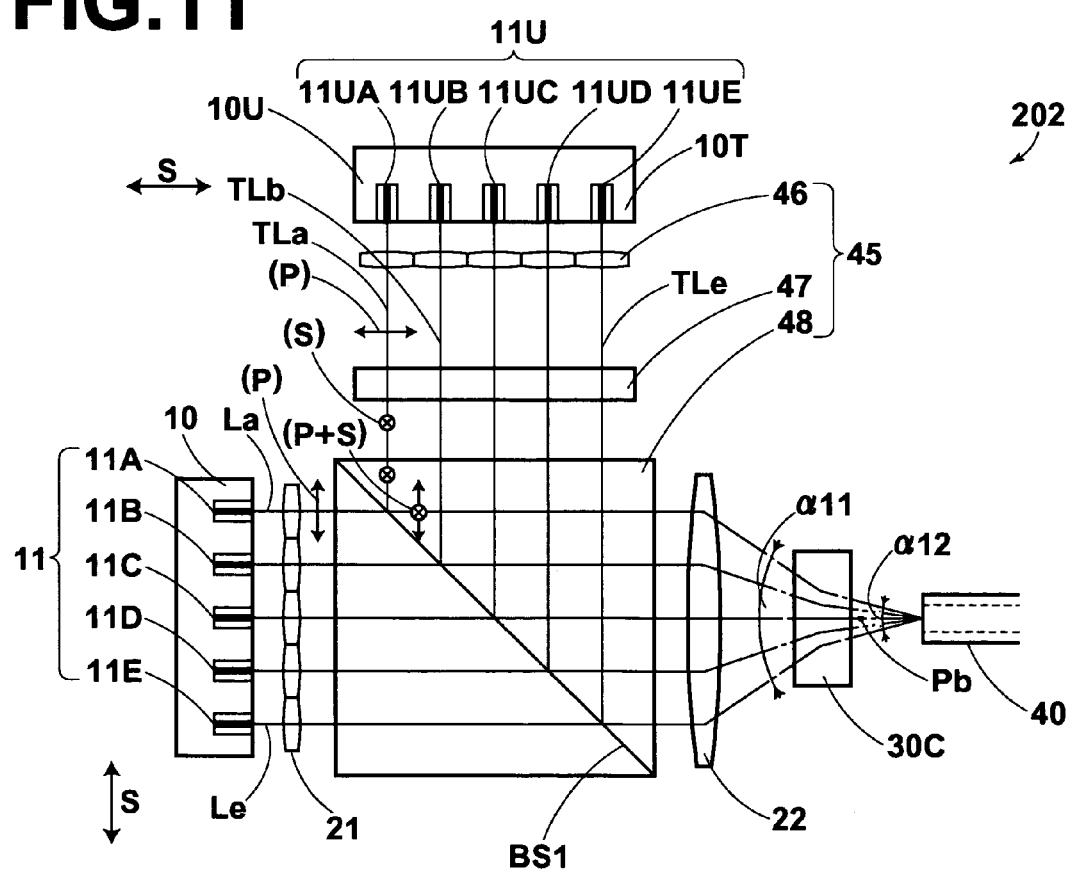
Figure 12:
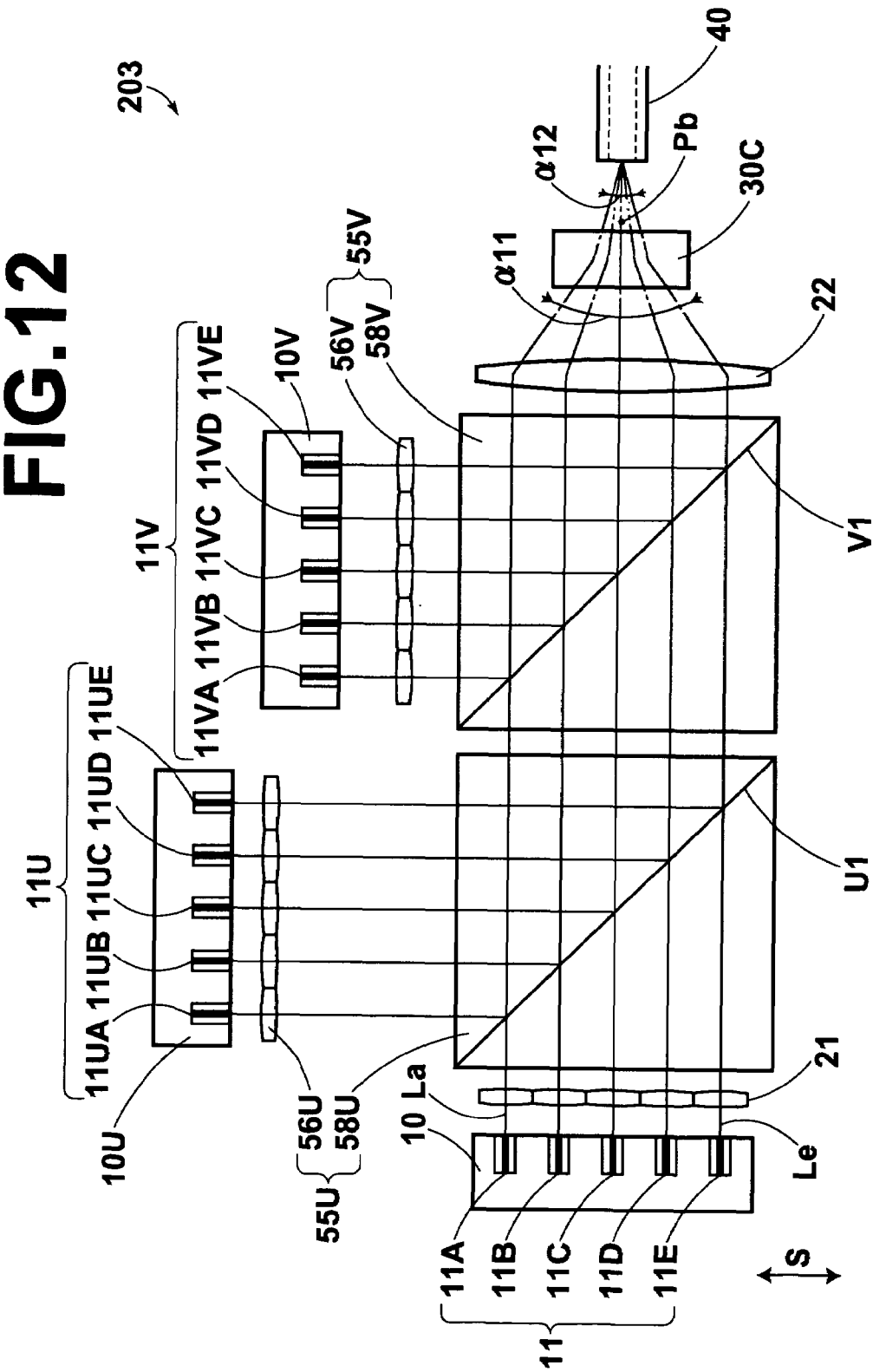
Figure 14A:
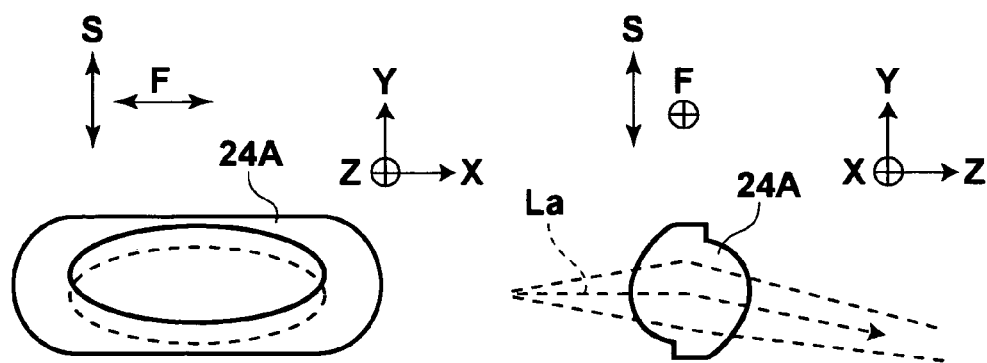
Figure 14B:
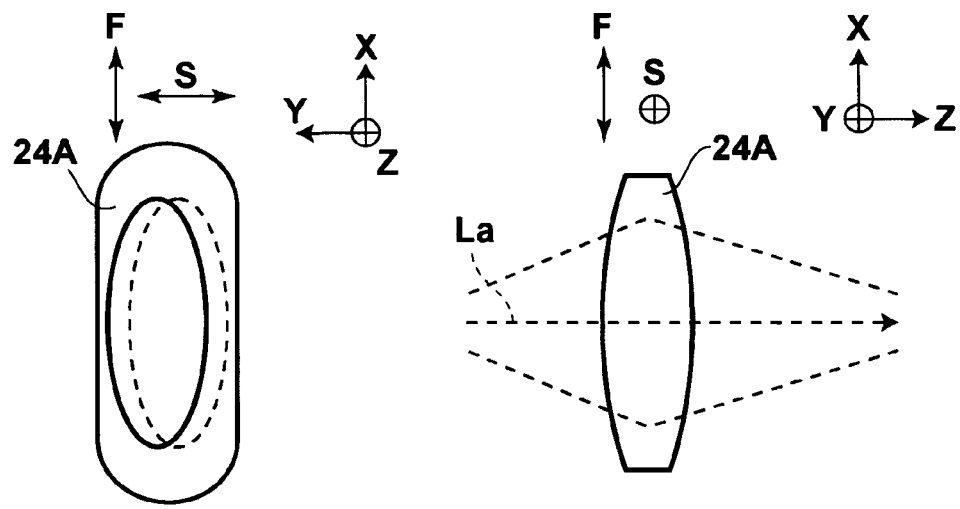
Figure 15:
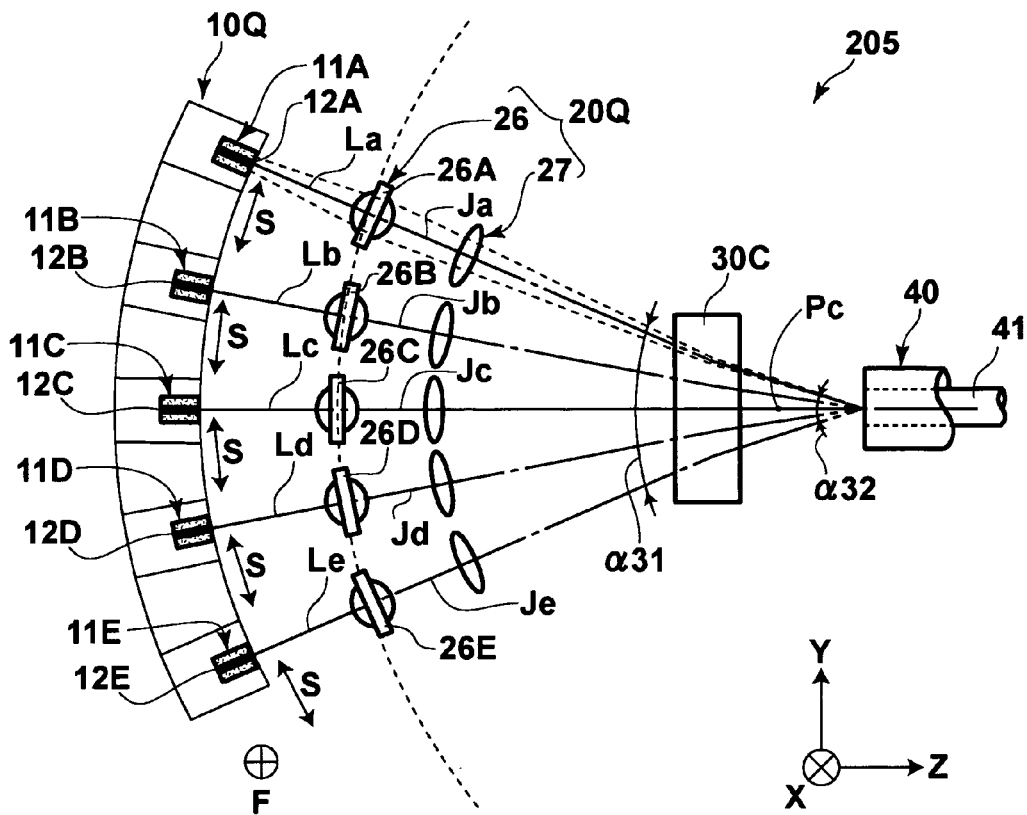
Figure 16:
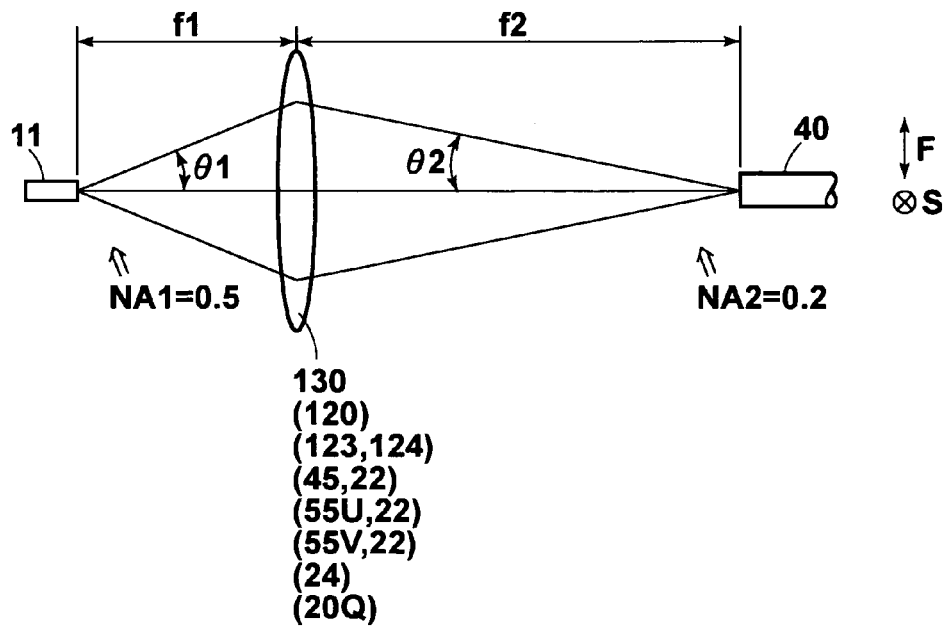
Figure 18:
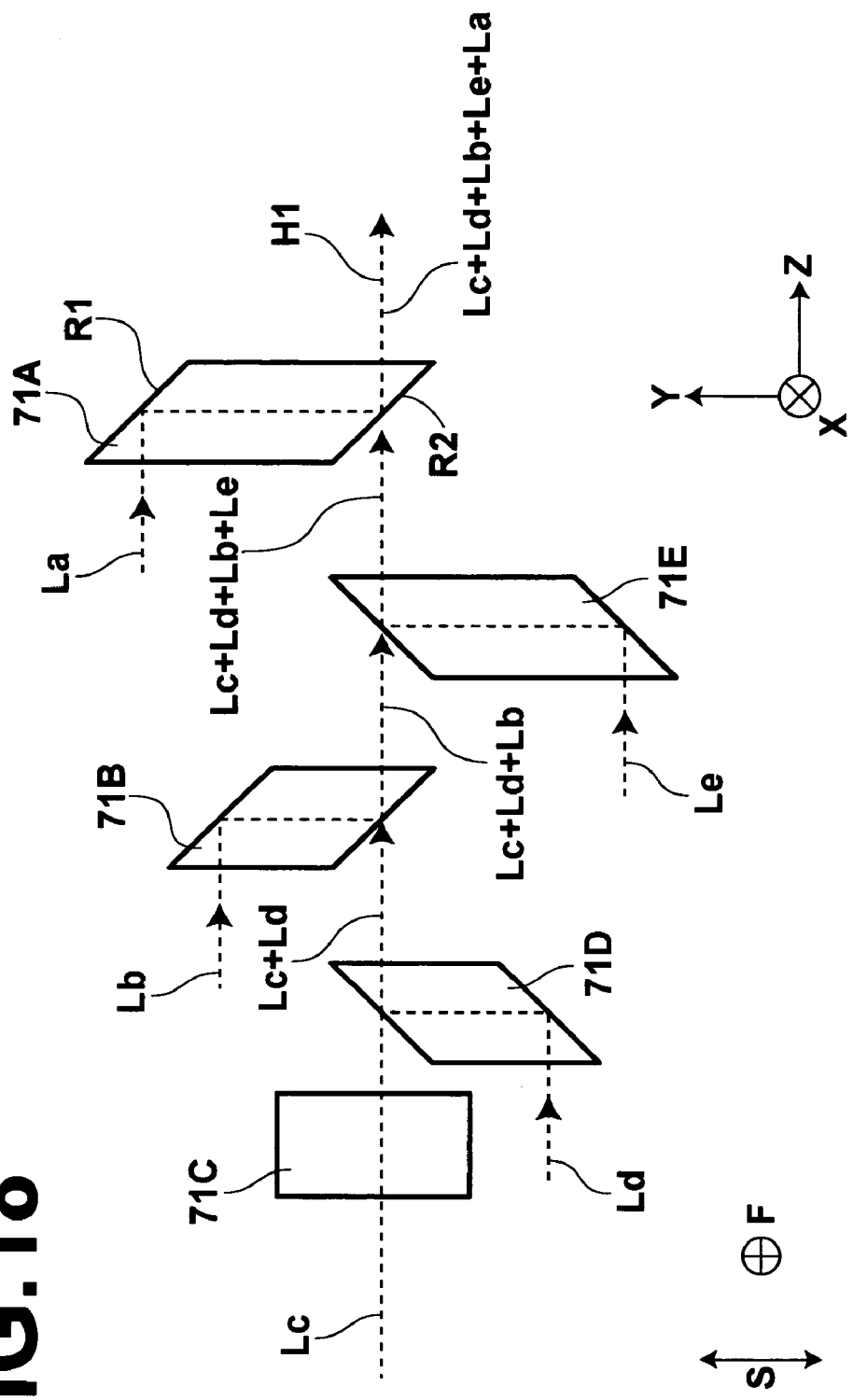
Figure 19A:
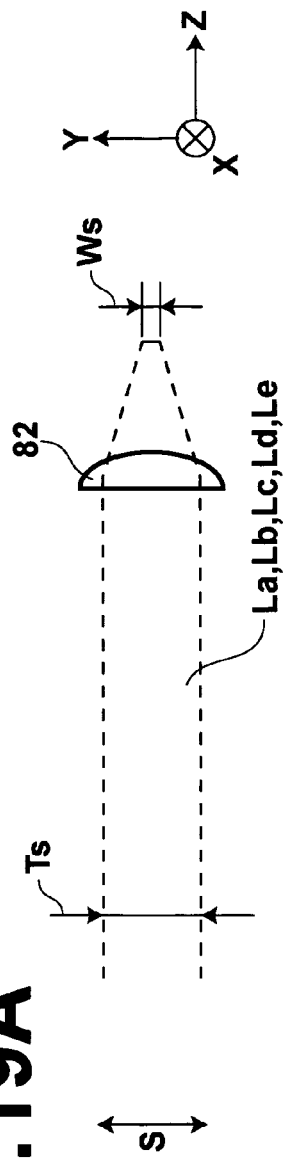
Figure 19B:
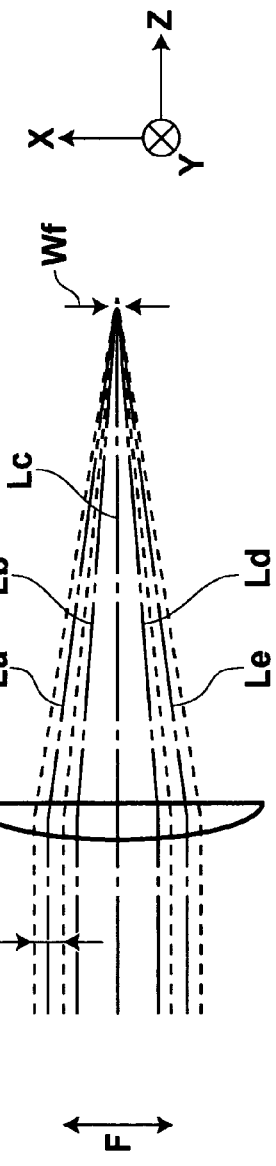

FIGS. 1A to 1C are views showing a brief arrangement of a laser beam synthesizing apparatus in accordance with an embodiment 1-1 of a first embodiment of the present invention, FIG. 2 is a perspective view showing a manner in which a laser beam bundle is radiated from the active layer of the semiconductor laser, FIGS. 3A and 3B are views showing a structure of the convergent angle transforming optical system and a state of the beam bundles synthesized in the optical fiber, FIGS. 4A and 4B are views showing the function of offsetting and converging the beam bundles of each of the converging/dispersion lens elements, FIGS. 5A to 5C are views showing a brief arrangement of a laser beam synthesizing apparatus in accordance with an embodiment 1-2 of a first embodiment of the present invention, FIGS. 6A and 6B are views showing the function of offsetting the beam bundles of each of the offset lens elements, FIG. 7 is a view in the slow axis view showing the function of changing the direction of the optical axes of the convergent angle transforming optical system, FIGS. 8A to 8C are plan views showing examples of the layout of the plurality of semiconductor lasers, FIGS. 9A to 9C are views showing a brief arrangement of a laser beam synthesizing apparatus in accordance with an embodiment 2-1 of a second embodiment of the present invention, FIG. 10 is a view in the slow axis view showing the function of changing the direction of the optical axes of the convergent angle transforming optical system, FIG. 11 is a plan view showing a brief arrangement of a laser beam synthesizing apparatus in accordance with an embodiment 2-2 of a second embodiment of the present invention, FIG. 12 is a plan view showing a brief arrangement of a laser beam synthesizing apparatus in accordance with an embodiment 2-3 of a second embodiment of the present invention which polarization-synthesizes beam bundles, FIGS. 13A to 13C are views showing a brief arrangement of a laser beam synthesizing apparatus in accordance with an embodiment 2-4 of a second embodiment of the present invention which wavelength-synthesizes the beam bundles, FIGS. 14A and 14B are views showing the function of each of the converging lens elements in the laser beam converging apparatus of the embodiment 2-4, FIG. 15 is a plan view showing a brief arrangement of a laser beam synthesizing apparatus in accordance with an embodiment 2-5 of a second embodiment of the present invention, FIG. 16 is a view showing properties of the converging optical system employed in the laser beam synthesizing apparatus, FIGS. 17A to 17C are views showing a brief arrangement of a laser beam synthesizing apparatus in accordance with a third embodiment of the present invention, FIG. 18 is a view showing the structure of the optical axis shift optical system, FIGS. 19A and 19B are views showing a manner in which beam bundles are converged by the converging optical system, FIGS. 20A and 20B are views showing in brief the arrangement of the conventional laser beam synthesizing apparatus, FIGS. 21A and 21B are views for illustrating the angle of convergence, FIG. 22 is a view showing a manner in which the beam bundle is passed through the redirection system, FIG. 23 is a view showing a manner in which the beam bundle is passed through the redirection system, FIGS. 24A and 21B are views showing a manner in which the beam bundles are passed through the redirection system in the correct position, FIGS. 25A and 25B are views showing a manner in which the beam bundles are passed through the redirection system positioned deviated from the correct position, and FIGS. 26A to 26C are views showing the area in which the converging/dispersion optical system can be positioned in the laser beam converging optical system of the present invention.

PREFERRED EMBODIMENT OF THE PRESENT INVENTION

A first embodiment of the present invention will be described, hereinbelow.

Embodiment 1-1

FIGS. 1A to 1C are views showing a brief arrangement of a laser beam synthesizing apparatus in accordance with an embodiment 1-1 of a first embodiment of the present invention, where FIG. 1A is a plan view showing the laser beam synthesizing apparatus as seen from above, FIG. 1B is a front view showing the laser beam synthesizing apparatus as seen in the direction in which the semiconductor lasers are arranged, and FIG. 1C is a left side view showing the laser beam synthesizing apparatus as seen in the direction of the optical axes of the beam bundles. FIG. 2 is a perspective view showing a manner in which a laser beam bundle is radiated from the active layer of the semiconductor laser, and FIGS. 3A and 3B are views showing a structure of the convergent angle transforming optical system and a state of the beam bundles synthesized in the optical fiber through the convergent angle transforming optical system, where FIG. 3A is a plan view showing the structure of the convergent angle transforming optical system and FIG. 3B is a front view showing the structure of the convergent angle transforming optical system. FIGS. 4A and 4B are views showing a state where the converging/dispersion lens elements offsets and converges the beam bundles, where FIG. 4A are views showing the optical bundle passing through the converging/dispersion lens elements as seen from Z- and X- directions with Y-direction directed upward, and FIG. 4B are views showing the optical bundle passing through the converging/dispersion lens elements as seen from Z- and Y- directions with X-direction directed upward.

As shown in FIGS. 1A to 1C, the laser beam synthesizing apparatus 101 of the embodiment 1-1 comprises a laser block 110 in which a plurality of semiconductor lasers are arranged, a converging/dispersion lens 120, and a convergent angle transforming optical system 30.

The laser block 110 comprises a plurality of independent semiconductor lasers 11A, 11B, 11C, . . . (sometimes referred to as "semiconductor lasers 11", all together) arranged so that their active layers 12A, 12B, 12C, . . . (sometimes referred to as "active layers 12", all together) are arranged in a plane H1 and radiates beam bundles having parallel slow axes in the plane H1.

Each of the semiconductor lasers 11 is an edge-emitting type nitride semiconductor laser whose output is 1 W and oscillation wavelength is 400 to 420 nm, and as shown in FIG. 2, each of the semiconductor lasers 11 is 1 μm in light emitting width Df in the direction of thickness of the active layer 12 (in the direction of F axis in FIG. 2: sometimes referred to as "the direction of the fast axis", hereinbelow) and 10 μm in light emitting width Ds in the direction parallel to the direction of the thickness of the active layer 12 perpendicular to the direction of the fast axis (in the direction of S axis in FIG. 2: sometimes referred to as "the direction of the slow axis", hereinbelow). The beam bundles radiated from the semiconductor lasers 11 are 0.5 in the effective numerical aperture Na(f) in the direction of the fast axis and 0.2 in the effective numerical aperture Na(s) in the direction of the slow axis. "The direction of the fast axis" as used here is the direction perpendicular to the active layer of the edge-emitting type semiconductor laser and "the direction of the slow axis" as used here is the direction parallel to the active layer of the edge-emitting type semiconductor laser. That the effective numerical aperture Na(f) in the direction of the fast axis is 0.5 is typical to the beam bundle radiated from a semiconductor laser.

X-direction, Y-direction and Z-direction are perpendicular to each other with the direction of the fast axis of the beam bundle radiated from the semiconductor lasers 11 (the direction in which the angle of divergence is large) equal to X-direction and the direction of the slow axis of the beam bundle radiated from the semiconductor lasers 11 (the direction in which the angle of divergence is small) equal to Y-direction.

The laser block 110 comprises five semiconductor lasers 11A, 11B, 11C, 11D and 11E.

The converging/dispersion lens 120 comprises converging/dispersion lens elements 121A, 121B, 121C . . . which are disposed in correspondence with each of the beam bundles La, Lb, Lc . . . radiated from the semiconductor lasers, converges the whole beam bundle made up of the beam bundles La, Lb, Lc . . . so that the width in the direction of the slow axis of the whole beam bundle is narrowed, offsets the beam bundles in different positions (P1, P2, P3, . . . ) in the direction of the fast axis, converges the beam bundles La, Lb, Lc . . . in the directions of the respective fast and slow axes, and then introduces the beam bundles La, Lb, Lc . . . into the convergent angle transforming optical system 30 in predetermined positions 39A, 39B, 39C, . . . different from each other in the direction of the respective fast axes. That is, the converging/dispersion lens 120 has functions of offsetting the whole beam bundle, converging the optical axes of the respective beam bundles, and converging the respective beam bundles. The angle of convergence means an angle in YZ plane at which the whole beam bundle sees the direction of convergence when converging the whole beam bundle so that the width in the direction of the slow axis is narrowed, that is, the angle of convergence in the fast axis view. The converging/dispersion lens 120 is a truncate type lens comprising the converging/dispersion lens elements 121A, 121B, 121C . . .

The convergent angle transforming optical system 30 which is a redirection system makes smaller the angle of convergence α2 of the whole beam bundle than the angle of convergence α1 when the whole beam bundle is radiated from the converging/dispersion lens 120 and then introduces the whole beam bundle into an core 41 of an optical fiber 40. The convergent angle transforming optical system 30 is disposed further upstream of the upstream-most position Pa in the positions where the optical axes of the beam bundles intersect each other in the fast axis view (in YZ plane, here).

The core 41 of the optical fiber 40 is 50 μm in diameter and 0.2 in numerical aperture NA.

The numerical aperture NA in the fast axis view of the converging/dispersion lens 120 is set larger than the numerical aperture NA of the optical fiber 40.

As shown in FIGS. 3A and 3B, the convergent angle transforming optical system 30 comprises a plurality of overlapping prisms 31A, 31B, 31C, . . . which are thin in the direction of the fast axis (X-direction) and changes the directions of propagation of the beam bundles La, Lb, Lc . . . , which have been converged so that the width in the direction of the slow axis of the whole beam bundle is narrowed by the converging/dispersion lens 120 and are different from each other in the angle of incidence of their optical axes to the convergent angle transforming optical system 30 in the fast axis view, by introducing the beam bundles La, Lb, Lc . . . into the corresponding prisms 31A, 31B, 31C, . . . . That is, the prisms 31A, 31B, 31C, 31D and 31E make smaller in the fast axis view the convergent angle of the whole beam bundle as radiated from the converging/dispersion lens 120 and at the same time converge the optical axes of the beam bundles introduced into the convergent angle transforming optical system 30 in a divergent state (See FIG. 3B). The central prism 31C has been set not to change the direction of propagation of the beam bundle since it transmits the beam bundle Lc which propagates toward the center of the optical fiber.

Operation of the above embodiment will be described, hereinbelow.

The beam bundles La, Lb, Lc . . . which are radiated from the plurality of semiconductor lasers 11A, 11B, 11C . . . and have their respective slow axes in the same plane H1 are converged so that the width in the direction of the slow axis of the whole beam bundle made up of the beam bundles La, Lb, Lc . . . is narrowed (that is, are converged in the fast axis view) and at the same time, are offset in different positions P1, P2, P3 . . . in the directions of the respective fast axes through the converging/dispersion lens elements 121A, 121B, 121C . . . . At the same time, the beam bundles La, Lb, Lc . . . are converged in the directions of the respective fast axes and the respective slow axes.

That is, the converging/dispersion lens elements 121A, 121B, 121C . . . making up the converging/dispersion lens 120 have different refractive powers and change the directions of propagation of the beam bundles La, Lb, Lc . . . . As shown in FIGS. 4A and 4B, the converging/dispersion lens element 121A positioned in the periphery of the whole beam bundle largely changes the direction of propagation of the beam bundle La in the direction of the slow axis S so that the spaces between the optical axes are narrowed and changes the direction of propagation of the beam bundle La in the direction of the fast axis F so that the spaces between the optical axes are widened while converging the beam bundle La and introducing it into the corresponding prism 31A of the convergent angle transforming optical system 30. The converging/dispersion lens element 121C positioned at the center of the whole beam bundle converges the beam bundle Lc and introduces it into the corresponding prism 31C of the convergent angle transforming optical system 30 changing the direction of propagation of the beam bundle Lc in neither of the directions of the slow axis S and the fast axis F. The solid line in the respective left side views of FIG. 4A and 4B, which are views of the converging/dispersion lens element 121A as seen from the direction of Z-axis, shows the lens face of the converging/dispersion lens element 121A on the side of the semiconductor laser 11A, whereas the broken line in the same views shows the lens face of the converging/ dispersion lens element 121A on the side of the convergent angle transforming optical system 30. The centers of curvature of the respective lens faces are obliquely shifted from each other in the directions of X-axis and Y-axis.

Then the beam bundles La, Lb, Lc . . . impinge upon the corresponding prisms 31A, 31B, 31C, . . . of the convergent angle transforming optical system 30 from the positions 39A, 39B, 39C, . . . different from each other in the direction of the fast axis F, and the directions of the optical axes of the beam bundles La, Lb, Lc . . . are changed so that the convergent angle of the whole beam bundle as radiated from the converging/dispersion lens 120 is made smaller in the fast axis view and the optical axes of the beam bundles introduced into the convergent angle transforming optical system 30 in a divergent state are converged in the slow axis view by the prisms 31A, 31B, 31C, . . . . Thereafter, the whole beam bundle is introduced into the core 41 of the optical fiber 40. The beam bundles are propagated through the converging/dispersion lens 120 and the convergent angle transforming optical system 30 so that the beam waists of the respective beam bundles are on the inlet end face of the core 41.

Thus, the beam bundles each having an output of 0.5 W radiated from the five semiconductor lasers 11A, 11B, 11C . . . are synthesized in the core 41 of the optical fiber 40 and a synthesized laser beam of output of 2.25 W is radiated from the core 41. That is, the five laser beam bundles are synthesized in the optical fiber at a coupling efficiency of 90%.

Embodiment 1-2

A laser beam synthesizing apparatus in accordance with an embodiment 1-2 of a first embodiment of the present invention will be described, hereinbelow. FIGS. 5A to 5C are views showing a brief arrangement of the laser beam synthesizing apparatus, where FIG. 5A is a plan view showing the laser beam synthesizing apparatus as seen from above, FIG. 5B is a plan view showing the laser beam synthesizing apparatus as seen in the direction in which the semiconductor lasers are arranged, and FIG. 5C is a left side view showing the laser beam synthesizing apparatus as seen in the direction of the optical axes of the beam bundles. FIGS. 6A and 6B are views showing a function of offsetting the light bundles of the offset lens element forming the offset lens, where FIG. 6A are schematic views of the lens element with Y-direction directed upward, and FIG. 6B are schematic views of the lens element with X-direction directed upward. FIG. 7 is a view showing a state where the convergent angle transforming optical system makes gentler the degree of convergence of the optical axis of the whole beam bundle which is sharply converged in the slow axis view.

The laser beam synthesizing apparatus 102 comprises an offset lens which is an offsetting means and a condenser lens which converges the whole beam bundle provided separately from each other in place of the converging/dispersion lens which is the converging/dispersion optical system in the embodiment 1-1, and is of the same structure as the embodiment 1-1 in the other aspects. Accordingly, the systems analogous to those in the laser beam synthesizing apparatus 101 of the embodiment 1-1 are given the same reference numerals and will not be described here.

The laser beam synthesizing apparatus 102 comprises as a converging/dispersion optical system an offset lens 123 which is disposed in correspondence with the beam bundles radiated from a plurality of semiconductor lasers 11A, 11B, 11C, . . . and collimates the respective beam bundles while offsetting the beam bundles in different positions in the direction of the fast axis, and a condenser lens 124 which converges the whole beam bundle made up of the beam bundles radiated from the offset lens so that the width in the direction of the slow axis is narrowed and at the same time, converges the beam bundles in the directions of the respective slow axes and the fast axes and introduces the beam bundles into the convergent angle transforming optical system 30B in different positions in the direction of the respective fast axes.

The offset lens 123 is a truncate type lens comprising a plurality of offset lens elements 123A, 123B, 123C, . . . disposed in correspondence with the beam bundles. The optical system formed by the offset lens 123 and the condenser lens 124 functions equivalent to the converging/dispersion lens 120 in the embodiment 1-1.

The beam bundles La, Lb, Lc . . . which are radiated from the plurality of semiconductor lasers 11A, 11B, 11C . . . and have their respective slow axes in the same plane H1 are offset in different positions in the directions of the respective fast axes through the offset lens 123. More specifically, the offset lens elements 123A, 123B, 123C . . . making up the offset lens 120 have different refractive powers and change the directions of propagation of the beam bundles as shown in FIGS. 6A and 6B. At the same time, the beam bundles La, Lb, Lc . . . are converged in the directions of the respective fast axes and the respective slow axes. The offset lens element 123A positioned in the periphery of the whole beam bundle changes the direction of propagation of the beam bundle La in the direction of the fast axis F without charging the direction of propagation of the beam bundle La in the direction of the slow axis S and then introduces it into the condenser lens 124. The offset lens element 123C positioned at the center of the whole beam bundle and introduces the beam bundle Lc into the condenser lens 124 changing the direction of propagation of the beam bundle Lc in neither of the directions of the slow axis S and the fast axis F. The solid line in the respective left side views of FIGS. 6A and 6B, which are views of the offset lens element 123A as seen from the direction of Z-axis, shows the lens face of the offset lens element 123A on the side of the semiconductor laser 11A, whereas the broken line in the same views shows the lens face of the offset lens element 123A on the side of the convergent angle transforming optical system 30B. The centers of curvature of the respective lens faces are shifted from each other in the direction of X-axis.

The whole beam bundle made up of the beam bundles La, Lb, Lc . . . radiated from the offset lens 123 and passed through the condenser lens 124 is converged so that the width in the slow axis is narrowed and the respective beam bundles are converged in the directions of the respective slow axes and the fast axes.

Then the beam bundles La, Lb, Lc . . . impinge upon the corresponding prisms of the convergent angle transforming optical system 30B from the positions different from each other in the direction of the fast axis F, and the convergent angle $\alpha 1$ of the whole beam bundle is made smaller to $\alpha 2$ in the fast axis view by the respective prisms and the directions of the optical axes of the beam bundles are changed so that the optical axes of the beam bundles which have been propagated in such a manner that their optical axes are sharply converged are gently converged in the slow axis view as shown in FIG. 7, and then the whole beam bundle is introduced into the core 41 of the optical fiber 40. That is, as in the above embodiment, the angle of convergence $\alpha 2$ as radiated from the convergent angle transforming optical system 30B is smaller than the angle of convergence α1 as radiated from the condenser lens 124. Also in this case, the convergent angle transforming optical system 30B is disposed further upstream of the upstream-most position Pa in the positions where the optical axes of the beam bundles intersect each other in the fast axis view.

Thus, the beam bundles each having an output of 0.5 W radiated from the five semiconductor lasers 11A, 11B, 11C . . . are synthesized in the core 41 of the optical fiber 40 and a synthesized laser beam of output of 2.25 W is radiated from the core 41. That is, the five laser beam bundles are synthesized in the optical fiber at a coupling efficiency of 90%.

The systems of the laser beam synthesizing apparatuses in accordance with the embodiments 1-1 and 1-2 described above and embodiments 2-1 to 2-5 and 3-1 to be described later can be applied also to optical fiber lasers (laser beam synthesizing apparatus) having a stacked structure (a structure in which a plurality of semiconductor lasers are stacked in the direction of the fast axis) disclosed in, for instance, Japanese Unexamined Patent Publication Nos. 2002-287640 and 2002-201979 of this applicant by optimizing design of the layout of the semiconductor lasers, the beam bundle converging/dispersing function of the converging/dispersion optical system comprising a truncate type lens, the convergent angle transforming function of the convergent angle transforming optical system, and the like.

FIGS. 8A to 8C are views showing arrangements of a plurality of semiconductor lasers, where FIG. 8A is a view showing an arrangement in which a plurality of semiconductor lasers are arranged independently from each other, FIG. 8B is a view showing an arrangement in which a plurality of semiconductor lasers are distributed on a plurality of substrates and FIG. 8C is a view showing an arrangement in which a plurality of semiconductor lasers are coupled into a laser bar.

Though, in the above embodiments 1-1 and 1-2, a plurality of semiconductor lasers 15A, 15B, . . . are arranged independently from each other as shown in FIG. 8A, at least two 17A, 17B of the plurality of semiconductor lasers may be integrated into a laser bar.

More particularly, at least two of the plurality of semiconductor lasers 17A, 17B, . . . , e.g., 17A and 17B, 17C and 17D, 17E and 17F, may be integrated as shown in FIG. 8B. Further, all the semiconductor lasers 18A to 18E may be integrated into a single laser bar 18 as shown in FIG. 8C.

As shown in FIGS. 5A to 5C, the laser beam synthesizing apparatus of the embodiment 1-2 may be employed to excite a medium Kb of a solid state laser or a medium Fb of a fiber laser by the synthesized beam bundle Lx made up of beam bundles which are radiated from the semiconductor lasers 11 and introduced into the core 41 of the optical fiber 40 to be synthesized therein or directly by the whole bundle made up of beam bundles which are radiated from the semiconductor lasers 11 and radiated from the convergent angle transforming optical system 30B.

That is, the laser beam synthesizing apparatus may be employed to excite a medium Kb of a solid state laser to generate a laser beam Lk through oscillation between an output mirror M1 and a reflecting mirror M2 or to excite a medium Fb of a fiber laser disposed in the core 41 of the optical fiber 40 to generate a laser beam Lf by the synthesized beam bundle Lx made up of beam bundles which are introduced into the core 41 of the optical fiber 40 to be synthesized therein or by the whole bundle Lg radiated from the convergent angle transforming optical system 30B.

When the synthesized beam bundle Lx is an infrared beam, it is preferred that the media Kb and Fb include at least one of rare earth elements $Nd^{3+}$ and $Yb^{3+}$. When the synthesized beam bundle Lx is 350 nm to 460 nm in wavelength, it is preferred that the media Kb and Fb include at least one of rare earth elements $Pr^{3+}$, $Er^{3+}$ and $Ho^{3+}$.

Excitation of the laser medium of a solid state laser or the laser medium of a fiber laser by the synthesized beam bundle synthesized in the optical fiber can be applied to the above embodiment 1-1 and embodiments 2-1 to 2-5 and 3-1 to be described later.

The second embodiment of the present invention will be described with reference to the drawings, hereinbelow.

The elements analogous to those in the first embodiment are given the same reference numerals and will not be described here.

Embodiment 2-1

FIGS. 9A to 9C are views showing a brief arrangement of the laser beam synthesizing apparatus 201 in accordance with an embodiment 2-1 of a second embodiment of the present invention, where FIG. 9A is a plan view showing the laser beam synthesizing apparatus as seen from above, FIG. 9B is a front view showing the laser beam synthesizing apparatus as seen in the direction in which the semiconductor lasers are arranged, and FIG. 9C is a view showing the laser beam synthesizing apparatus as seen in the direction of the optical axes of the beam bundles. FIG. 10 is a view in the slow axis view showing that the convergent angle transforming optical system converges the optical axes of the beam bundles which have been parallel to each other.

As shown in FIGS. 9A to 9C, the laser beam synthesizing apparatus 201 of the embodiment 2-1 comprises a laser block 10, a whole converging optical system 20 and a convergent angle transforming optical system 30C.

The laser block 10 comprises a plurality of semiconductor lasers 11A, 11B, 11C, . . . (sometimes referred to as "semiconductor lasers 11", all together) arranged so that their active layers 12A, 12B, 12C, . . . (sometimes referred to as "active layers 12", all together) are parallel to each other and positioned in different positions 13A, 13B, 13C, . . . in the direction of thickness (the direction of arrow X) and radiates beam bundles having parallel slow axes. That is, the laser block 10 is provided with steps on which the semiconductor lasers are rested.

Each of the semiconductor lasers 11 is an edge-emitting type nitride semiconductor laser whose output is 1 W and oscillation wavelength is 400 to 420 nm, and each of the semiconductor lasers 11 is 1 μm in light emitting width Df in the direction of the fast axis F and 25 μm in light emitting width Ds in the direction the slow axis S. The beam bundles radiated from the semiconductor lasers 11 are 0.5 in the effective numerical aperture Na(f) in the direction of the fast axis and 0.2 in the effective numerical aperture Na(s) in the direction of the slow axis. As described above in conjunction with the first embodiment, "the direction of the fast axis F" as used here is the direction of thickness of the active layer of the edge-emitting type semiconductor laser and "the direction of the slow axis" as used here is the direction parallel to the active layer of the edge-emitting type semiconductor laser. The direction in which the angle of divergence of the beam bundle radiated from the semiconductor laser 11 is larger is the direction of the fast axis (the direction of arrow F) and the direction in which the angle of divergence of the beam bundle is smaller is the direction of the slow axis (the direction of arrow S).

The laser block 10 comprises five semiconductor lasers 11A, 11B, 11C, 11D and 11E.

The whole converging optical system 20 converges the whole beam bundle made up of the beam bundles La, Lb, Lc . . . , radiated from the semiconductor lasers to have slow axes parallel to each other and to be different in position in the direction of the fast axis F, so that the width in the direction of the slow axis (in the direction of arrow Y, here) of the whole beam bundle is narrowed, converges the beam bundles La, Lb, Lc . . . in the directions of the respective fast (in the direction of arrow X, here) and slow axes, and then introduces the beam bundles La, Lb, Lc . . . into the convergent angle transforming optical system 30C in predetermined positions 39A, 39B, 39C, . . . different from each other in the direction of the respective fast axes. The optical axes of the beam bundles La, Lb, Lc . . . as radiated from the whole converging optical system 20 are parallel to each other in the slow axis view.

The convergent angle transforming optical system 30C which is a redirection system makes smaller in the fast axis view the angle of convergence α12 of the whole beam bundle than the angle of convergence α11 when the whole beam bundle is radiated from the whole converging optical system 20 and then introduces the whole beam bundle into the core 41 of the optical fiber 40. The convergent angle transforming optical system 30C is disposed further upstream of the upstream-most position Pb in the positions where the optical axes of the beam bundles intersect each other in the fast axis view. The core 41 of the optical fiber 40 is 50 μm in diameter and 0.2 in numerical aperture NA.

The convergent angle transforming optical system 30C converges in the slow axis view the optical axes of the beam bundles La, Lb, Lc . . . which have been parallel to each other as shown in FIG. 10.

The numerical aperture NA in the fast axis view of the whole converging optical system 20 is set larger than the numerical aperture NA of the optical fiber 40.

The whole converging optical system 20 comprises collimator lens elements 21A, 21B, 21C . . . (will be sometimes referred to as "collimator lens elements 21" all together) which collimate in both the directions of the slow and fast axes the beam bundles La, Lb, Lc . . . radiated from the plurality of semiconductor lasers 11, and a whole converging lens 22 which converges the whole beam bundle, made up of the beam bundles La, Lb, Lc . . . , so that the width in the direction of the slow axis is narrowed. The collimator lens 21 is formed as a truncate type lens.

In the above arrangement, the direction of the fast axis is always X-direction.

Operation of the above embodiment will be described, hereinbelow.

The beam bundles La, Lb, Lc . . . which are radiated from the plurality of semiconductor lasers 11A, 11B, 11C . . . and are in different positions in the direction of the fast axis are collimated by the collimator lens elements 21A, 21B, 21C, . . . , and the whole beam bundle made up of the beam bundles La, Lb, Lc . . . which are collimated by the collimator lens elements 21 and are in different positions in the direction of the fast axis converged so that the width in the direction of the slow axis S is narrowed by the whole converging lens 22.

Thereafter, the beam bundles La, Lb, Lc . . . are introduced into the corresponding prisms 31A, 31B, 31C, . . . of the convergent angle transforming optical system 30C in predetermined positions 39A, 39B, 39C, . . . different from each other in the direction of the fast axis F and the directions of the optical axes of the beam bundles La, Lb, Lc . . . are changed by the prisms 31A, 31B, 31C, . . . so that the convergent angle of the whole beam bundle is made smaller in the fast axis view and the optical axes of the beam bundles converge in the slow axis view. Then the whole beam bundle is introduced into the core 41 of the optical fiber 40. The beam bundles are propagated through the whole converging optical system 20 and the convergent angle transforming optical system 30C so that the beam waists of the respective beam bundles are near to the inlet end face of the core 41.

The angle of convergence α12 of the whole beam bundle as radiated from the convergent angle transforming optical system 30C is smaller than the angle of convergence all when the whole beam bundle is radiated from the whole converging optical system 20.

Thus, the beam bundles each having an output of 1.0 W radiated from the five semiconductor lasers 11A, 11B, 11C . . . are synthesized in the core 41 of the optical fiber 40 and a synthesized laser beam of output of 4.5 W is radiated from the core 41. That is, the five laser beam bundles are synthesized in the optical fiber at a coupling efficiency of 90%.

Embodiment 2-2

A laser beam synthesizing apparatus in accordance with an embodiment 2-2 of a second embodiment of the present invention will be described, hereinbelow. FIG. 11 shows in brief the laser beam synthesizing apparatus in accordance with the embodiment 2-2.

The laser beam synthesizing apparatus 202 of the embodiment 2-2 comprises, in addition to the laser beam synthesizing apparatus of the embodiment 2-1, a polarization-synthesizing means which polarization-synthesizes beam bundles radiated from additional semiconductor lasers with beam bundles radiated from the plurality of semiconductor lasers. The elements analogous to those in the laser beam synthesizing apparatus 201 of the embodiment 2-1 are given the same reference numerals and will not be described here.

The laser beam synthesizing apparatus 202 of the embodiment 2-2 is provided with a laser block 10 on which five semiconductor lasers 11A, 11B, 11C, 11D and 11E are arranged, collimator lens elements 21 which collimate in both the directions of the slow and fast axes the beam bundles La, Lb, Lc . . . radiated from the plurality of semiconductor lasers 11, a whole converging lens 22 which converges the whole beam bundle, made up of the beam bundles La, Lb, Lc . . . collimated by the collimator lens elements 21 so that the width in the direction of the slow axis is narrowed, and converges the beam bundles La, Lb, Lc . . . in the directions of the slow and fast axes, and then introduces the beam bundles La, Lb, Lc . . . into the convergent angle transforming optical system 30C in predetermined positions 39A, 39B, 39C, . . . different from each other in the direction of the fast axis, and the convergent angle transforming optical system 30C which is a redirection system and makes smaller the angle of convergence α12 of the whole beam bundle than the angle of convergence α11 when the whole beam bundle is converged by the whole converging lens 22 so that the width in the direction of the slow axis is narrowed and then introduces the whole beam bundle into the core 41 of the optical fiber 40.

The laser beam synthesizing apparatuses 202 further comprises a laser block 10T on which additional semiconductor lasers 11TA, 11TB, . . . (sometimes referred to as "semiconductor laser 11T", all together) other than the plurality of semiconductor lasers 11A, 11B, . . . are arranged and a polarization-synthesizing means 45 which polarization-synthesizes beam bundles TLa, TLb, TLc . . . radiated from the additional semiconductor lasers 11T with the beam bundles La, Lb, Lc . . . radiated from the plurality of semiconductor lasers 11 on the optical path along which the beam bundles La, Lb, Lc . . . radiated from the semiconductor lasers 11 impinge upon the optical fiber 40, and introduces the beam bundles TLa, TLb, TLc radiated from said additional semiconductor lasers 11T into the optical fiber 40 together with the beam bundles La, Lb, Lc . . . radiated from the plurality of semiconductor lasers 11.

The polarization-synthesizing means 45 comprises a plurality of collimator lens elements 46, a half-wave plate 47 and a polarization beam splitter 48. The polarization beam splitter 48 is disposed between the plurality of collimator lens elements 21 and the whole converging lens 22, and the half-wave plate 47 and the plurality of collimator lens elements 46 are disposed between the semiconductor lasers 11T and the polarization beam splitter 48.

The laser block 10T is substantially the same as the laser block 10 and the active layers of the semiconductor lasers 11T are arranged in correspondence to those of the semiconductor lasers 11. That is, the active layers of the semiconductor lasers 11TA and 11A are positioned in a plane, and the active layers of the semiconductor lasers 11TB and 11B are positioned in a plane. Thus the active layers of the corresponding semiconductor lasers are positioned in the same plane.

The collimator lens elements 46 are substantially the same as the collimator lens elements 21 and makes the beam bundles TLa, TLb, TLc . . . radiated from said additional semiconductor lasers 11T parallel beam bundles whose optical axes are parallel to each other.

The half-wave plate 47 changes the direction of linearly polarized light and changes by 90° the direction of polarization of the beam bundles TLa, TLb, TLc . . . impinging upon the half-wave plate 47.

The elements described above are arranged so that the optical axes of the beam bundles radiated from the semiconductor lasers 11T and those of the beam bundles radiated from the semiconductor lasers 11 are perpendicular to each other.

The polarization beam splitter 48 transmits p-polarized light components, which are linearly polarized light components parallel to the surface of the paper in FIG. 11 and reflects s-polarized light components, which are linearly polarized light components perpendicular to the surface of the paper. That is, the polarization beam splitter 48 transmits light radiated from the semiconductor lasers 11 and passed through the collimator lens elements 21 and reflects light radiated from the semiconductor lasers 11T and passed through the collimator lens elements 46 and the half-wave plate 47.

The beam bundles La, Lb, Lc . . . comprising p-polarized light components radiated from the plurality of semiconductor lasers 11A, 11B . . . are introduced into the optical fiber 40 by way of the collimator lens elements 21, the polarization beam splitter 48, the whole converging lens 22 and the convergent angle transforming optical system 30C, whereas the beam bundles TLa, TLb, TLc . . . comprising p-polarized light components radiated from the plurality of semiconductor lasers 11T are collimated by the collimator lens elements 46, changed to the beam bundles TLa, TLb, TLc . . . comprising s-polarized light components by their direction of polarization being rotated by 90° by the half-wave plate 47, and then reflected by the beam splitting face BS1 of the polarization beam splitter 48. After reflected by the polarization beam splitter 48, the beam bundles TLa, TLb, TLc . . . are introduced into the optical fiber 40 by way of the same optical path as the beam bundles La, Lb, Lc . . . transmitted through the polarization beam splitter 48. That is, the corresponding beam bundles, TLa and La, TLb and Lb, . . . TLe and Le impinge upon the optical fiber 40 through thee same optical path. The convergent angle transforming optical system makes smaller the angle of convergence α12 of the whole beam bundle than the angle of convergence α11 when the whole beam bundle is converged by the whole converging lens 22 and then introduces the whole beam bundle into the core 41 of the optical fiber 40.

As in the embodiment 2-1, the convergent angle transforming optical system 30C is disposed further upstream of the upstream-most position Pb in the positions where the optical axes of the beam bundles La, Lb, Lc . . . intersect each other in the fast axis view.

The technique of obtaining a high output laser beam by the use of the polarization-synthesizing means can be applied to the above embodiments 1-1, 1-2 and 2-1 and embodiments 2-3 to 2-5 and 3-1 to be described later.

Embodiment 2-3

A laser beam synthesizing apparatus in accordance with an embodiment 2-3 of a second embodiment of the present invention will be described, hereinbelow. FIG. 12 shows in brief the laser beam synthesizing apparatus in accordance with the embodiment 2-3.

The laser beam synthesizing apparatus 203 of the embodiment 2-3 comprises, in addition to the laser beam synthesizing apparatus 201 of the embodiment 2-1, a wavelength-synthesizing means which wavelength-synthesizes beam bundles radiated from additional semiconductor lasers with beam bundles radiated from the plurality of semiconductor lasers. The elements analogous to those in the laser beam synthesizing apparatus 201 of the embodiment 2-1 are given the same reference numerals and will not be described here.

The laser beam synthesizing apparatus 203 of the embodiment 2-3 is provided with a laser block 10 on which five semiconductor lasers 11A, 11B, 11C, 11D and 11E are arranged, collimator lens elements 21 which collimate in both the directions of the slow axis s and the fast axis F the beam bundles La, Lb, Lc . . . radiated from the plurality of semiconductor lasers 11, a whole converging lens 22 which converges the whole beam bundle, made up of the beam bundles La, Lb, Lc . . . collimated by the collimator lens elements 21 so that the width in the direction of the slow axis is narrowed, and converges the beam bundles La, Lb, Lc . . . in the directions of the slow and fast axes, and then introduces the beam bundles La, Lb, Lc . . . into the convergent angle transforming optical system 30C in predetermined positions . . . different from each other in the direction of the fast axis, and the convergent angle transforming optical system 30C which is a redirection system and makes smaller the angle of convergence α12 of the whole beam bundle than the angle of convergence α11 when the whole beam bundle is converged by the whole converging lens 22 so that the width in the direction of the slow axis is narrowed and then introduces the whole beam bundle into the core 41 of the optical fiber 40.

The laser beam synthesizing apparatuses 203 further comprises a laser block 10U on which additional semiconductor lasers 11UA, 11UB, . . . (sometimes referred to as "semiconductor laser 11U", all together) other than the plurality of semiconductor lasers 11A, 11B, . . . are arranged, a laser block 10V on which additional semiconductor lasers 11VA, 11VB, . . . (sometimes referred to as "semiconductor laser 11V", all together) other than the plurality of semiconductor lasers 11A, 11B, . . . are arranged, a wavelength-synthesizing means 55U which wavelength-synthesizes beam bundles ULa, ULb, ULc . . . radiated from the additional semiconductor lasers 11U with the beam bundles La, Lb, Lc . . . radiated from the plurality of semiconductor lasers 11 on the optical path along which the beam bundles La, Lb, Lc . . . radiated from the semiconductor lasers 11 impinge upon the optical fiber 40, and a wavelength-synthesizing means 55V which wavelength-synthesizes beam bundles VLa, VLb, VLc . . . radiated from the additional semiconductor lasers 11V with the beam bundles La, Lb, Lc . . . radiated from the plurality of semiconductor lasers 11 on the optical path along which the beam bundles La, Lb, Lc . . . radiated from the semiconductor lasers 11 impinge upon the optical fiber 40 and introduces the beam bundles radiated from said additional semiconductor lasers 11U and 11V into the optical fiber 40 together with the beam bundles La, Lb, Lc . . . radiated from the plurality of semiconductor lasers 11.

The wavelength of the beam bundles radiated from the semiconductor lasers 11 is 410 nm, the wavelength of the beam bundles radiated from the semiconductor lasers 11U is 370 nm, and the wavelength of the beam bundles radiated from the semiconductor lasers 11V is 450 nm.

The wavelength-synthesizing means 55U comprises a plurality of collimator lens elements 56U and a dichroic beam splitter 58U. The dichroic beam splitter 58U is disposed between the plurality of collimator lens elements 21 and the whole converging lens 22, and the collimator lens elements 56U are disposed between the semiconductor lasers 11U and the dichroic beam splitter 58U.

The wavelength-synthesizing means 55V comprises a plurality of collimator lens elements 56V and a dichroic beam splitter 58V. The dichroic beam splitter 58V is disposed between the plurality of collimator lens elements 21 and the whole converging lens 22, and the collimator lens elements 56V are disposed between the semiconductor lasers 11V and the dichroic beam splitter 58V.

The laser blocks 10U and 10V are substantially the same as the laser block 10 and the active layers of the semiconductor lasers 11U and 11V are arranged in correspondence to those of the semiconductor lasers 11. That is, the active layers of the semiconductor lasers 11UA and 11VA are positioned in the same plane as that of the semiconductor laser 11A, and the active layers of the semiconductor lasers 11UB and 11VB are positioned in the same plane as that of the semiconductor laser 11B. Thus the active layers of the corresponding semiconductor lasers are positioned in the same plane.

The optical axes of the beam bundles radiated from the semiconductor lasers 11U and 11V and those of the beam bundles radiated from the semiconductor lasers 11 are perpendicular to each other.

The collimator lens elements 56U are substantially the same as the collimator lens elements 21 and makes the beam bundles ULa, ULb, ULc . . . radiated from said additional semiconductor lasers 11U parallel beam bundles whose optical axes are parallel to each other.

The collimator lens elements 56V are substantially the same as the collimator lens elements 21 and makes the beam bundles VLa, VLb, VLc . . . radiated from said additional semiconductor lasers 11V parallel beam bundles whose optical axes are parallel to each other.

The dichroic beam splitter 58U transmits light of wavelength of 410 nm and reflects light of wavelength of 370 nm. The dichroic beam splitter 58V transmits light of wavelengths of 370 nm and 410 nm and reflects light of wavelength of 450 nm.

The beam bundles La, Lb, Lc . . . radiated from the plurality of semiconductor lasers 11A, 11B . . . are introduced into the optical fiber 40 byway of the collimator lens elements 21, the dichroic beam splitter 58U, the dichroic beam splitter 58V, the whole converging lens 22 and the convergent angle transforming optical system 30C.

The beam bundles ULa, ULb, ULc . . . radiated from the plurality of semiconductor lasers 11U are collimated by the collimator lens elements 56U, and then reflected by the beam splitting face U1 of the dichroic beam splitter 58U. After reflected by the dichroic beam splitter 58U, the beam bundles ULa, ULb, ULc . . . are introduced into the optical fiber 40 by way of the same optical path as the beam bundles La, Lb, Lc . . . transmitted through the dichroic beam splitter 58U. That is, the corresponding beam bundles, ULa and La, ULb and Lb, ULe and Le impinge upon the optical fiber 40 through the same optical path.

The beam bundles VLa, VLb, VLc . . . radiated from the plurality of semiconductor lasers 11V are collimated by the collimator lens elements 56V, and then reflected by the beam splitting face V1 of the dichroic beam splitter 58V. After reflected by the dichroic beam splitter 58V, the beam bundles VLa, VLb, VLc . . . are introduced into the optical fiber 40 by way of the same optical path as the beam bundles La, Lb, Lc . . . and ULa, ULb, ULc . . . transmitted through the dichroic beam splitter 58V. That is, the corresponding beam bundles, VLa, ULa and La, VLa, ULb and Lb, . . . VLe, ULe and Le impinge upon the optical fiber 40 through the same optical path.

In this way, the beam bundles La, Lb, Lc . . . , ULa, ULb, ULc . . . and VLa, VLb, VLc . . . are synthesized in the optical fiber 40.

As in the embodiment 2-1, the convergent angle transforming optical system 30C is disposed further upstream of the upstream-most position Pb in the positions where the optical axes of the beam bundles La, Lb, Lc . . . intersect each other in the fast axis view.

The technique of obtaining a high output laser beam by the use of the polarization-synthesizing means can be applied to the above embodiments 1-1, 1-2, 2-1 and 2-2 and embodiments 2-4, 2-5 and 3-1 to be described later.

Embodiment 2-4

FIGS. 13A to 13C are views showing a brief arrangement of the laser beam synthesizing apparatus in accordance with an embodiment 2-4 of a second embodiment of the present invention, where FIG. 13A is a plan view showing the laser beam synthesizing apparatus as seen from above, FIG. 13B is a front view showing the laser beam synthesizing apparatus as seen in the direction in which the semiconductor lasers are arranged, and FIG. 13C is a view showing the laser beam synthesizing apparatus as seen in the direction of the optical axes of the beam bundles. FIGS. 14A and 14B are views showing a function of the converging lens element forming the converging lens, where FIG. 14A are schematic views of the lens element with Y-direction directed upward, and FIG. 14B are schematic views of the lens element with X-direction directed upward.

As shown in FIGS. 13A to 13C, the laser beam synthesizing apparatus of the embodiment 2-4 is substantially the same as the laser beam synthesizing apparatus 201 of the embodiment 2-1 except that a truncate converging lens 24 comprising a plurality of converging lens elements 24A, 24B, 24C . . . is employed as the whole converging optical system comprising the converging lens elements 21 and the whole converging lens 22 in the embodiment 2-4.

That is, the converging lens 24 comprises a plurality of converging lens elements 24A, 24B, 24C . . . which are different in refractive power and change the direction of propagation of the beam bundles, and converges the whole beam bundle made up of the beam bundles La, Lb, Lc . . . radiated from the semiconductor lasers 11 so that the width in the direction of the slow axis of the whole beam bundle is narrowed, converges the beam bundles La, Lb, Lc . . . in the directions of the fast and slow axes, and then introduces the beam bundles La, Lb, Lc . . . into the convergent angle transforming optical system 30 in predetermined positions 39A, 39B, 39C, . . . different from each other in the direction of the fast axis F.

As shown in FIGS. 14A and 14B, the converging lens element 24A positioned in the periphery of the whole beam bundle largely changes the direction of propagation of the beam bundle La in the direction of the slow axis while converging the beam bundle La and introducing it into the corresponding prism 31A (FIGS. 3A and 3B) of the convergent angle transforming optical system 30C. The converging lens element 24C positioned at the center of the whole beam bundle converges the beam bundle Lc and introduces it into the corresponding prism 31C of the convergent angle transforming optical system 30C without changing the direction of propagation of the beam bundle Lc.

The solid line in the respective left side views of FIGS. 14A and 14B, which are views of the converging lens element 24A as seen from the direction of Z-axis, shows the lens face of the converging lens element 24A on the side of the semiconductor laser 11A, whereas the broken line in the same views shows the lens face of the converging lens element 24A on the side of the convergent angle transforming optical system 30C. The centers of curvature of the respective lens faces are shifted from each other in the direction of Y-axis.

The laser beam synthesizing apparatus of the embodiment 2-4 is the same as the embodiment 2-1 in the other feature, and by virtue of the convergent angle transforming optical system 30C, the angle of convergence α22 of the whole beam bundle than the angle of convergence α21 when the whole beam bundle is converged by the converging lens 24 and then the whole beam bundle is introduced into the core 41 of the optical fiber 40.

As in the embodiment 2-1, the convergent angle transforming optical system 30C is disposed further upstream of the upstream-most position Pb in the positions where the optical axes of the beam bundles La, Lb, Lc . . . intersect each other in the fast axis view.

Embodiment 2-5

A laser beam synthesizing apparatus in accordance with an embodiment 2-3 of a second embodiment of the present invention will be described, hereinbelow. FIG. 15 is a plan view showing in brief the laser beam synthesizing apparatus in accordance with the embodiment 2-5 as seen from above.

As shown in FIG. 15, the laser block 10Q of the laser beam synthesizing apparatus 205 of the embodiment 2-5 comprises five semiconductor lasers 11A, 11B, 11C, . . . arranged so that their active layers 12A, 12B, 12C, . . . are parallel to each other and positioned in different positions 13A, 13B, 13C, . . . in the direction of thickness of the active layers 12 (the direction of arrow X) and so that the spaces between the optical axes of the beam bundles La, Lb, Lc . . . radiated from the semiconductor lasers 11 become narrower away from the semiconductor lasers 11 in the fast axis view.

Accordingly, the slow axes of the beam bundles La, Lb, Lc . . . as radiated from the semiconductor lasers 11 are not parallel to each other.

The whole converging optical system 20Q converges in the directions of the slow axis and the fast axis (the direction of arrow X) the beam bundles La, Lb, Lc . . . radiated from the semiconductor lasers 11 and different in positions in the direction of the fast axis, and introduces the beam bundles La, Lb, Lc . . . into the convergent angle transforming optical system 30C in positions different from each other in the direction of the fast axis as in the same manner as described above.

The whole converging optical system 20Q comprises collimator lens elements 26A, 26B, 26C which collimate the beam bundles La, Lb, Lc . . . and condenser lens elements 27A, 27B, 27C . . . which condense the beam bundles La, Lb, Lc . . . in the directions of the slow axis and the fast axis.

The optical axes of the beam bundles La, Lb, Lc . . . as radiated from the semiconductor lasers 11 and those of the same beam bundles as radiated from the whole converging optical system 20Q are aligned with each other. The optical axes of the beam bundles La, Lb, Lc . . . are indicated at Ja, Jb, Jc . . . in FIG. 15.

In this particular embodiment, the convergent angle α31 of the whole beam bundle as radiated from the whole converging optical system 20Q is equal to the convergent angle of the whole beam bundle as radiated from the semiconductor lasers 11, and the convergent angle α32 of the whole beam bundle as radiated from the convergent angle transforming optical system 30C is smaller than the convergent angle α31 of the whole beam bundle as radiated from the whole converging optical system 20Q.

The laser beam synthesizing apparatus of the embodiment 2-5 is the same as the embodiment 2-1, and 2-2 in the other feature.

When the collimator lens elements 26A, 26B, 26C . . . are 3 mm in focal length and 0.6 in numerical aperture, and the condenser lens elements 27A, 27B, 27C . . . are 9 mm in focal length and 0.2 in numerical aperture, the beam bundles each having an output of 1 W radiated from the five semiconductor lasers 11A, 11B, 11C . . . are synthesized in the core 41 of the optical fiber 40 and a synthesized laser beam of output of 4.5 W is radiated from the core 41. That is, the five laser beam bundles are synthesized in the optical fiber at a coupling efficiency of 90%.

As in the embodiment 2-1, the convergent angle transforming optical system 30C is disposed further upstream of the upstream-most position Pc in the positions where the optical axes of the beam bundles La, Lb, Lc . . . intersect each other in the fast axis view.

In the laser beam synthesizing apparatus of the embodiments 1-1, 1-2, and 2-1 to 2-5, the optical system, which converges the beam bundles radiated from the semiconductor lasers 11 in the directions of the slow axis and the fast axis, makes smaller in the slow axis view the exit angle of the beam bundles as converged thereby than the radiation angle of the beam bundles as radiated from the semiconductor lasers.

That is, the divergence in the direction of the fast axis of a beam bundle radiated from an edge-emitting type semiconductor laser (i.e., the divergence in the slow axis view) employed in this invention is about 0.5 in terms of numerical apertures NA (NA1≈0.5) and the divergence of the incident light when light is introduced into a typical optical fiber is not larger than 0.3 which is smaller than NA1 and normally about 0.2 in terms of numerical apertures NA (NA2≈0.2) Accordingly, as an important point in efficiently coupling beam bundles radiated from semiconductor lasers to an optical fiber, there has been wide known a method in which the exit angle of the beam bundles as introduced into the optical fiber from the optical system is made smaller as compared with the radiation angle of the beam bundles as radiated from the semiconductor lasers. The light impinging upon the area outside the range defined by the numerical aperture NA2 of the optical fiber travels outside the optical fiber without coupled to the mode of the optical fiber.

Accordingly, in the laser beam synthesizing apparatuses of the embodiments 1-1, 1-2, and 2-1 to 2-5, by introducing light radiated from semiconductor lasers, each 0.5 in numerical aperture NA, into the range of the optical fiber 40, where the numerical aperture NA2 is 0.2, through a beam bundle converging means 130, light radiated from the semiconductor lasers can be coupled to the optical fiber at a high efficiency. For this purpose, it is necessary that the magnification Re=f2/f1=NA2/NA1=0.5/0.2=2.5.

Accordingly, it is necessary to design the beam bundle converging means 130 to be larger than 1.0 in magnification Re in order to realize the coupling at a high efficiency.

That is, it is necessary to design the beam bundle converging means 130 so that the exit angle θ2 in the slow axis view of the beam bundles as converged by the beam bundle converging means 130 (each of the optical systems) shown in FIG. 16 is smaller than the radiation angle θ1 in the slow axis view of the beam bundles as radiated by the semiconductor laser 11 in order to realize the coupling at a high efficiency.

Each of the converging/dispersion lens 120 of the laser beam synthesizing apparatus 101 of the embodiment 1-1, the optical system of the combination of the offset lens 123 and the condenser lens 124 of the laser beam synthesizing apparatus 102 of the embodiment 1-2, the whole converging optical system 20 of the laser beam synthesizing apparatus 201 of the embodiment 2-1, the optical system of the combination of the polarization-synthesizing means 45 and the whole converging lens 22 of the laser beam synthesizing apparatus 202 of the embodiment 2-2, the optical system of the combination of the wavelength-synthesizing means 55U and the whole converging lens 22 and the optical system of the combination of the wavelength-synthesizing means 55V and the whole converging lens 22 of the laser beam synthesizing apparatus 203 of the embodiment 2-3, the condenser lens 24 of the laser beam synthesizing apparatus 204 of the embodiment 2-4, and the whole converging optical system 20Q of the laser beam synthesizing apparatus 205 of the embodiment 2-5 corresponding to the beam bundle converging means 130 is designed so that the exit angle θ2 in the slow axis view of the beam bundles converged by each of the optical systems is smaller than the radiation angle θ1 in the slow axis view of the beam bundles.

However, the laser beam synthesizing apparatuses of the present invention need not be limited to those in which the beam bundle converging means is designed so that the exit angle θ2 in the slow axis view of the beam bundles as radiated therefrom is smaller than the radiation angle θ1 in the slow axis view of the beam bundles as radiated by the semiconductor laser.

Embodiment 3-1

A laser beam synthesizing apparatus in accordance with an embodiment 3-1 of a third embodiment of the present invention will be described, hereinbelow. In the embodiment 3-1, the elements analogous in function to those of the embodiments 2-1 to 2-5 are given the same reference numerals and will not be described here.

FIGS. 17A to 17C are views showing a brief arrangement of the laser beam synthesizing apparatus in accordance with an embodiment 3-1 of a third embodiment of the present invention, where FIG. 17A is a plan view showing the laser beam synthesizing apparatus as seen from above, FIG. 17B is a front view showing the laser beam synthesizing apparatus as seen in the direction in which the semiconductor lasers are arranged, and FIG. 17C is a left side view showing the laser beam synthesizing apparatus as seen in the direction of the optical axes of the beam bundles. FIG. 18 is a plan view showing the structure of the optical axis shift optical system. FIGS. 19A and 19B are views showing a manner in which beam bundles are converged by the converging optical system, where FIG. 19A is a view showing a manner in which the beam bundles are converged in the direction of the slow axis, and FIG. 19B is a view showing a manner in which the beam bundles are converged in the direction of the fast axis.

The laser beam synthesizing apparatus 301 of the embodiment 3-1 comprises a laser block on which a plurality of semiconductor lasers 51A, 51B, 51C, . . . (sometimes referred to as "semiconductor lasers 51", all together) are arranged so that their active layers 52A, 52B, 52C, . . . are parallel to each other and positioned in different positions 53A, 53B, 53C, . . . in the direction of thickness (the direction of arrow X), a collimator optical system 60 which collimates the beam bundles La, Lb, Lc . . . radiated from the semiconductor lasers 51 to have optical axes parallel to each other and slow axes S parallel to each other, an optical axis shift optical system 70 which is a redirection system and shifts in the direction of the slow axis (the direction of arrow S) the beam bundles which have been passed through the collimator optical system 60 and are different in position in the direction of the fast axis (the direction of arrow F) so that the fast axes of the beam bundles La, Lb, Lc . . . are arranged in a plane H2 perpendicular to the slow axis S, and a converging optical system 80 which converges the whole beam bundle comprising the beam bundles La, Lb, Lc . . . radiated from the optical axis shift optical system 70 and the beam bundles La, Lb, Lc . . . in the directions of the slow axis S and the fast axis F and introduces the same into the optical fiber 40.

Each of the semiconductor lasers 51 is, as in the embodiments 2-1 to 2-5, an edge-emitting type nitride semiconductor laser whose output is 1W, oscillation wavelength is 400 to 420 nm, 1 μm in light emitting width Df in the direction of the fast axis F and 25 μm in light emitting width Ds in the direction of the slow axis S. The beam bundles radiated from the semiconductor lasers 11 are 0.5 in the effective numerical aperture Na(f) in the direction of the fast axis F and 0.2 in the effective numerical aperture Na(s) in the direction of the slow axis S.

The collimator optical system 60 is a truncate type lens comprising a plurality of collimator lens elements 61A, 61B, 61C . . . .

As shown in FIG. 18, the optical axis shift optical system 70 comprises a plurality of thin prisms 71A, 71B, 71C . . . stacked in the direction of X and for instance, the beam bundle La impinging upon the prism 71A is reflected by parallel planes R1 and R2 of the prism 71A so that its optical axis is shifted in the plane H2 and radiated from the prism 71A. The other prisms work substantially in the same manner. However, since the optical axis of the beam bundle Lc is in the plane H2 before it impinges upon the optical axis shift optical system 70, the beam bundle Lc passes through the prism 71C with its optical path not shifted. For example, the prism 71C may be an optical flat which does not change the optical path of a beam bundle.

The converging optical system 80, as shown in FIGS. 19A and 19B, comprises an F converging lens 81 which converges in the direction of the fast axis F the whole beam bundle made up of the beam bundles radiated from the optical axis shift optical system 70 and an S converging lens 82 which converges the whole beam bundle in the direction of the slow axis S.

Operation of the above embodiment will be described, hereinbelow.

The beam bundles La, Lb, Lc . . . radiated from the semiconductor lasers 51 are made to parallel beam bundles which have parallel optical axes S and slow axes and are different in position in the direction of the fast axis F by the collimator optical system 60 and then impinge upon the corresponding prisms 71A, 71B, 71C . . . of the optical axis shift optical system 70.

Then the beam bundles La, Lb, Lc . . . are shifted in the direction of the slow axis S by the prisms 71A, 71B, 71C . . . so that their fast axis are arranged in the plane H2 perpendicular to the slow axis S, and then is radiated from the optical axis shift optical system 70.

The whole beam bundle made up of the beam bundles La, Lb, Lc . . . radiated from the optical axis shift optical system 70 is converged in the direction of the fast axis F (in X-Z plane) by the F converging lens 81 and in the direction of the slow axis S (in Y-Z plane) by the S converging lens 82, and then introduced into the core 41 50 μm in diameter of the optical fiber 40.

The laser beam synthesizing apparatuses in accordance with the embodiments 1-1 and 1-2, 2-1 to 2-5 and 3-1 can be applied also to optical fiber lasers (laser beam synthesizing apparatus) having a stacked structure (a structure in which a plurality of semiconductor lasers are stacked in the direction of the fast axis) disclosed in, for instance, Japanese Unexamined Patent Publication Nos. 2002-287640 and 2002-201979 of this applicant by optimizing design of the layout of the semiconductor lasers, the beam bundle convergent angle of the truncate type lens, the convergent angle transforming function of the convergent angle transforming optical system, the optical axis shift function of the optical axis shift optical system and the like.

In the laser beam synthesizing apparatuses in accordance with the embodiments 1-1 and 1-2, 2-1 to 2-5 and 3-1, optical fibers which are 25 μm to 400 μm in core diameter, especially those which are 50 μm to 100 μm in core diameter, are employed as the optical fiber 40 in which the beam bundles are synthesized.

Further, the truncate type lens employed in the embodiments 1-1 and 1-2, 2-1 to 2-5 and 3-1 may be either a spherical lens or an aspheric lens. The lenses described above as a truncate type lens in the embodiments need not be limited to a truncate type lens but may be a normal lens which is circle in the direction of its optical axis.

In the laser beam synthesizing apparatuses in accordance with the embodiments 1-1 and 1-2, 2-1 to 2-5 and 3-1, for instance, the following semiconductor lasers different in the light emitting width Ds (FIG. 2) from those described above can be employed.

Singlemode Semiconductor Lasers

Those which is in singlemode in the transverse mode (in the direction of the slow axis). Typically, 1 μm to 3 μm in the light emitting width Ds and several mW to 500 mW in output power.

Multimode Semiconductor Lasers

Those which is in multimode in the transverse mode (in the direction of the slow axis). Typically, several μm to 100 μm in the light emitting width Ds and 100 mW to 2000 mW in output power.

Further, the convergent angle transforming optical system employed in the embodiments 1-1, 1-2, and 2-1 to 2-5 and the optical axis shift optical system employed in the embodiment 3-1 need not be limited to those formed by combining prisms but may be those formed by the use of a reflecting element, a refractive element, or a photonics crystal or combinations of these elements.

The number of the laser beams to be synthesized by the laser beam synthesizing apparatuses of the present invention need not be limited to five but may be any of two or more laser beams.

It is preferred that the wavelengths of the beam bundles radiated from the semiconductor lasers are not shorter than 350 nm and not longer than 460 nm but the wavelengths of the beam bundles may be outside this range. For example, they may be infrared rays.

What is claimed is:

1. A laser beam synthesizing method comprising offsetting in different positions in a direction of a fast axis a plurality of beam bundles radiated from a plurality of semiconductor lasers, converging optical axes of the beam bundles in the fast axis view, and introducing the beam bundles into an end face of an optical fiber after converging them in the directions of the fast axis and a slow axis, wherein the improvement comprises:

disposing a convergent angle transforming optical system between a converging optical system and a position where the optical axes of the beam bundles converged in the fast axis view intersect each other in the fast axis view, passing the whole beam bundle made up of the beam bundles converged in the fast axis view through the convergent angle transforming optical system so that the angle of convergence of the whole beam bundle or part of the beam bundles making up the whole beam bundle is made smaller in the fast axis view, and introducing the whole beam bundle into the end face of the optical fiber.

2. A laser beam synthesizing apparatus which comprises a plurality of semiconductor lasers and in which a plurality of beam bundles radiated from the plurality of semiconductor lasers are offset in different positions in a direction of a fast axis, optical axes of the beam bundles are converged in the fast axis view, and the beam bundles are introduced into an end face of an optical fiber after converging them in the directions of the fast axis and a slow axis, wherein the improvement comprises:

a convergent angle transforming optical system disposed between a converging optical system and a position where the optical axes of the converged beam bundles intersect each other in the fast axis view, wherein the convergent angle transforming optical system decreases an angle of convergence in the fast axis view of a whole beam bundle made up of the converged beam bundles and introduces the whole beam bundle into the end face of the optical fiber.

3. A laser beam synthesizing apparatus as defined in claim 2 further comprising a converging means which converges the beam bundles radiated from the plurality of semiconductor lasers in the directions of the fast and slow axes, wherein the converging means decreases the exit angles in the slow axis view of the beam bundles emanating therefrom smaller than the radiation angles in the slow axis view of the beam bundles at which they are radiated from the respective semiconductor lasers.

4. A laser beam synthesizing apparatus as defined in claim 2 in which the wavelengths of the beam bundles radiated from the plurality of semiconductor lasers are in the range of not shorter than 350 nm and not longer than 460 nm.

5. A laser beam synthesizing apparatus as defined in claim 2 further comprising an additional semiconductor laser other than the plurality of semiconductor lasers and a polarization-synthesizing means which polarization-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

6. A laser beam synthesizing apparatus as defined in claim 2 further comprising an additional semiconductor laser other than the plurality of semiconductor lasers and a wavelength-synthesizing means which wavelength-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

7. A laser beam synthesizing apparatus as defined in claim 2 further comprising an additional semiconductor laser other than the plurality of semiconductor lasers and a wavelength-synthesizing means which wavelength-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

8. A laser beam synthesizing apparatus as defined in claim 2 in which the synthesized beam bundle made up of the beam bundles introduced into the optical fiber and synthesized therein excites a medium of a solid state laser or a fiber laser.

9. A laser beam synthesizing apparatus as defined in claim 8 in which the synthesized beam bundle is an infrared beam and the medium includes at least one of rare earth elements $Nd^{3+}$ and $Yb^{3+}$.

10. A laser beam synthesizing apparatus as defined in claim 8 in which the synthesized beam bundle is 350 nm to 460 nm in wavelength and the medium includes at least one of rare earth elements $Pr^{3+}$, $Er^{3+}$ and $Ho^{3+}$.

11. A laser beam synthesizing apparatus as defined in claim 2 in which the whole beam bundle radiated from the convergent angle transforming optical system directly excites a medium of a solid state laser or a fiber laser.

12. A laser beam synthesizing apparatus as defined in claim 11 in which the synthesized beam bundle is an infrared beam and the medium includes at least one of rare earth elements $Nd^{3+}$ and $Yb^{3+}$.

13. A laser beam synthesizing apparatus as defined in claim 11 in which the synthesized beam bundle is 350 nm to 460 nm in wavelength and the medium includes at least one of rare earth elements $Pr^{3+}$, $Er^{3+}$ and $Ho^{3+}$.

14. The laser beam synthesizing apparatus of claim 2, further comprising collimating means.

15. A laser beam synthesizing apparatus comprising:
laser block;
a converging/dispersion optical system; and
a convergent angle transforming optical system,
wherein the laser block is a block in which a plurality of semiconductor lasers are arranged so that their active layers are in a plane wherein the semiconductor lasers radiate beam bundles having parallel slow axes in the plane,
the converging/dispersion optical system comprising converging/dispersion lens elements disposed in correspondence with each of the beam bundles radiated from the semiconductor lasers, converging the whole beam bundle made up of the beam bundles so that the width in the direction of the slow axis of the whole beam bundle is narrowed, offsetting the beam bundles in different positions in the direction of the fast axis, converging the beam bundles in the directions of the respective fast and slow axes and introducing the beam bundles into the convergent angle transforming optical system in predetermined positions different from each other in the direction of the respective fast axes, and
the convergent angle transforming optical system being disposed between the converging/dispersion optical system and a position where the optical axes of the beam bundles intersect each other in the fast axis view, making smaller the angle of convergence of the whole beam bundle than the angle of convergence when the whole beam bundle is radiated from the converging/dispersion optical system and then introducing the whole beam bundle into an optical fiber.

16. A laser beam synthesizing apparatus as defined in claim 15 in which the converging/dispersion optical system is an optical system comprising converging/dispersion lens elements which are disposed in correspondence with each of the beam bundles radiated from the semiconductor lasers and has both functions to offset the beam bundles in different positions in the direction of the fast axis and to converge the whole beam bundle made up of the beam bundles so that the width in the direction of the slow axis of the whole beam bundle is narrowed and converge the beam bundles in the directions of the respective fast and slow axes.

17. A laser beam synthesizing apparatus as defined in claim 16 in which the converging/dispersion lens elements form a truncate type lens.

18. A laser beam synthesizing apparatus as defined in claim 15 in which the converging/dispersion optical system comprises an offset optical system which are disposed in correspondence with each of the beam bundles and has a function to offset the beam bundles in different positions in the direction of the fast axis and a condenser optical system having a function to converge the whole beam bundle made up of the beam bundles radiated from the offset optical system so that the width in the direction of the slow axis of the whole beam bundle is narrowed, converge the beam bundles in the directions of the respective fast and slow axes and then introduce the beam bundles into the convergent angle transforming optical system in predetermined positions different from each other in the direction of the respective fast axes.

19. A laser beam synthesizing apparatus as defined in claim 18 in which the offset optical system comprises a truncate type lens.

20. A laser beam synthesizing apparatus as defined in claim 15 in which the plurality of semiconductor lasers are separated from each other.

21. A laser beam synthesizing apparatus as defined in claim 15 in which at least two of the plurality of semiconductor lasers are integrated.

22. A laser beam synthesizing apparatus as defined in claim 15 in which the synthesized beam bundle made up of the beam bundles introduced into the optical fiber and synthesized therein excites a medium of a solid state laser or a fiber laser.

23. A laser beam synthesizing apparatus as defined in claim 15 in which the whole beam bundle radiated from the convergent angle transforming optical system directly excites a medium of a solid state laser or a fiber laser.

24. A laser beam synthesizing apparatus comprising:
a laser block,
wherein the laser block comprises a plurality of semiconductor lasers arranged in parallel so that their active layers are positioned differently from one another in a direction of a thickness of the active layers, and
wherein the plurality of semiconductor lasers radiate beam bundles having slow axes parallel to each other;
a whole converging optical system,
wherein the whole converging optical system converges a whole beam bundle comprising the beam bundles having slow axes parallel to each other, wherein a width of the whole beam bundle in a direction of the slow axis is narrowed, thereby converging the beam bundles in the directions of the respective fast and slow axes; and
a convergent angle transforming optical system,
wherein the convergent angle transforming optical system is disposed between the whole converging optical system and a position where optical axes of the beam bundles intersect each other in a fast axis view and
wherein the convergent angle transforming optical system decreases the angle of convergence of the whole beam bundle to less than the angle of convergence resulting of the whole beam bundle radiated from the whole converging optical system.

25. A laser beam synthesizing apparatus as defined in claim 24 wherein the whole converging optical system directly converges the whole beam bundle so that the width of the whole beam bundle in the direction of the slow axis is narrowed, converges the beam bundles in the directions of the respective fast and slow axes, and introduces the beam bundles into the convergent angle transforming optical system in predetermined positions different from each other in the direction of the respective fast axes.

26. A laser beam synthesizing apparatus as defined in claim 25 in which the whole converging optical system comprises a truncate type lens.

27. A laser beam synthesizing apparatus as defined in claim 24 in which the whole converging optical system comprises collimator optical systems which are disposed in correspondence with the beam bundles to make parallel each of the beam bundles and a condenser optical system which converges the whole parallel beam bundles so that the width in the direction of the slow axis is narrowed, converges the beam bundles in the directions of the respective fast and slow axes and then introduces the beam bundles into the convergent angle transforming optical system in predetermined positions different from each other in the direction of the respective fast axes.

28. A laser beam synthesizing apparatus as defined in claim 25 in which the collimator optical system comprises a truncate type lens.

29. A laser beam synthesizing apparatus as defined in claim 24 further comprising an additional semiconductor laser other than the plurality of semiconductor lasers and a polarization-synthesizing means which polarization-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

30. A laser beam synthesizing apparatus as defined in claim 6 further comprising an additional semiconductor laser other than the plurality of semiconductor lasers and a wavelength-synthesizing means which wavelength-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

31. A laser beam synthesizing apparatus as defined in claim 24 in which the synthesized beam bundle made up of the beam bundles introduced into the optical fiber and synthesized therein excites a medium of a solid state laser or a fiber laser.

32. A laser beam synthesizing apparatus as defined in claim 24 in which the whole beam bundle radiated from the convergent angle transforming optical system directly excites a medium of a solid state laser or a fiber laser.

33. A laser beam synthesizing apparatus comprising:
a laser block in which a plurality of semiconductor lasers are arranged in parallel so that their active layers are disposed in different positions in the direction of thickness of the active layers,
wherein the plurality of semiconductor lasers radiates a plurality of beam bundles having slow axes parallel to each other and optical axes parallel to each other;
a collimator optical system which makes each of the beam bundles radiated from the plurality of semiconductor lasers parallel;
an optical axis shift optical system which shifts the beam bundles passing through the collimator optical system in the direction of slow axis of the beam bundle so that the optical axes of the beam bundles are arranged in a plane perpendicular to the slow axis;
a converging optical system which converges the whole beam bundle comprising the beam bundles whose optical axes are arranged in the plane in the directions of the fast and slow axes; and
an additional semiconductor laser other than the plurality of semiconductor lasers and a polarization-synthesizing means which polarization-synthesizes a beam bundle radiated from the additional semiconductor laser with beam bundles radiated from the plurality of semiconductor lasers on the optical path along which the beam bundles radiated from the semiconductor lasers impinge upon the optical fiber, whereby the beam bundle radiated from said additional semiconductor laser are introduced into the optical fiber together with the beam bundles radiated from the plurality of semiconductor lasers.

34. A laser beam synthesizing apparatus as defined in claim 33 in which the collimator optical system comprises a truncate type lens.

35. A laser beam synthesizing apparatus as defined in claim 33 in which the synthesized beam bundle made up of the beam bundles introduced into the optical fiber and synthesized therein excites a medium of a solid state laser or a fiber laser.

* * * * *